US008835241B2

(12) United States Patent
Ishibashi et al.

(10) Patent No.: US 8,835,241 B2
(45) Date of Patent: Sep. 16, 2014

(54) METHOD OF MANUFACTURING A SEMICONDUCTOR MEMORY DEVICE

(71) Applicant: Kabushiki Kaisha Toshiba, Minato-ku (JP)

(72) Inventors: Yutaka Ishibashi, Yokkaichi (JP);
Katsumasa Hayashi, Yokkaichi (JP);
Masahisa Sonoda, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 13/751,803

(22) Filed: Jan. 28, 2013

(65) Prior Publication Data

US 2013/0137237 A1    May 30, 2013

Related U.S. Application Data

(62) Division of application No. 12/879,281, filed on Sep. 10, 2010, now Pat. No. 8,389,970.

(30) Foreign Application Priority Data

Sep. 18, 2009 (JP) ................. 2009-218111

(51) Int. Cl.
*H01L 21/8238* (2006.01)
*H01L 45/00* (2006.01)
*H01L 27/24* (2006.01)
*H01L 49/02* (2006.01)
*H01L 27/10* (2006.01)

(52) U.S. Cl.
CPC ............... *H01L 28/00* (2013.01); *H01L 27/24* (2013.01); *H01L 27/101* (2013.01)
USPC ............ 438/221; 438/424; 257/E29.165; 257/E45.002

(58) Field of Classification Search
CPC .................. H01L 45/1675; H01L 45/1683
USPC ................... 438/221, 424, 430, 759
See application file for complete search history.

(56) References Cited

U.S. PATENT DOCUMENTS 6,169,688 B1   1/2001  Noguchi
6,287,752 B1   9/2001  Yoshikawa
(Continued)

FOREIGN PATENT DOCUMENTS

JP    2000-232107    8/2000
JP    2007-296510    11/2007
(Continued)

OTHER PUBLICATIONS

Japanese Office Action issued Nov. 22, 2011, in Patent Application No. 2009-218111 (with English-language translation).

*Primary Examiner* — Jerome Jackson, Jr.
*Assistant Examiner* — Paul Budd
(74) *Attorney, Agent, or Firm* — Oblon, Spivak, McClelland, Maier & Neustadt, L.L.P.

(57) ABSTRACT

According to one embodiment, a semiconductor memory device includes a substrate, an upper-layer wire provided on the substrate, a lower-layer wire provided on the substrate, a memory cell located at an intersection of the upper-layer wire and the lower-layer wire and includes a diode and a storage layer, a conductive layer located between the upper-layer wire and the memory cell in a direction perpendicular to the substrate surface, and an interlayer insulating film provided between memory cells. The position of an interface between the upper-layer wire and the interlayer insulating film is lower than a top surface of the conductive layer.

7 Claims, 42 Drawing Sheets

(56) References Cited

U.S. PATENT DOCUMENTS

| | | | |
|---|---|---|---|
| 7,915,602 B2 * | 3/2011 | Sato | 257/4 |
| 7,961,507 B2 * | 6/2011 | Liu et al. | 365/163 |
| 8,183,602 B2 | 5/2012 | Tabata et al. | |
| 2005/0205907 A1 | 9/2005 | Isenberger et al. | |
| 2008/0239932 A1 | 10/2008 | Kamata et al. | |
| 2010/0038617 A1 * | 2/2010 | Nakajima et al. | 257/2 |
| 2010/0117049 A1 * | 5/2010 | Lung et al. | 257/4 |
| 2010/0264392 A1 * | 10/2010 | Kawashima et al. | 257/2 |

FOREIGN PATENT DOCUMENTS

| | | |
|---|---|---|
| JP | 2008-276904 | 11/2008 |
| JP | 2008-306011 | 12/2008 |
| JP | 2009-130138 | 6/2009 |
| JP | 2009-130139 | 6/2009 |
| WO | WO 2009/063645 A1 | 5/2009 |

* cited by examiner

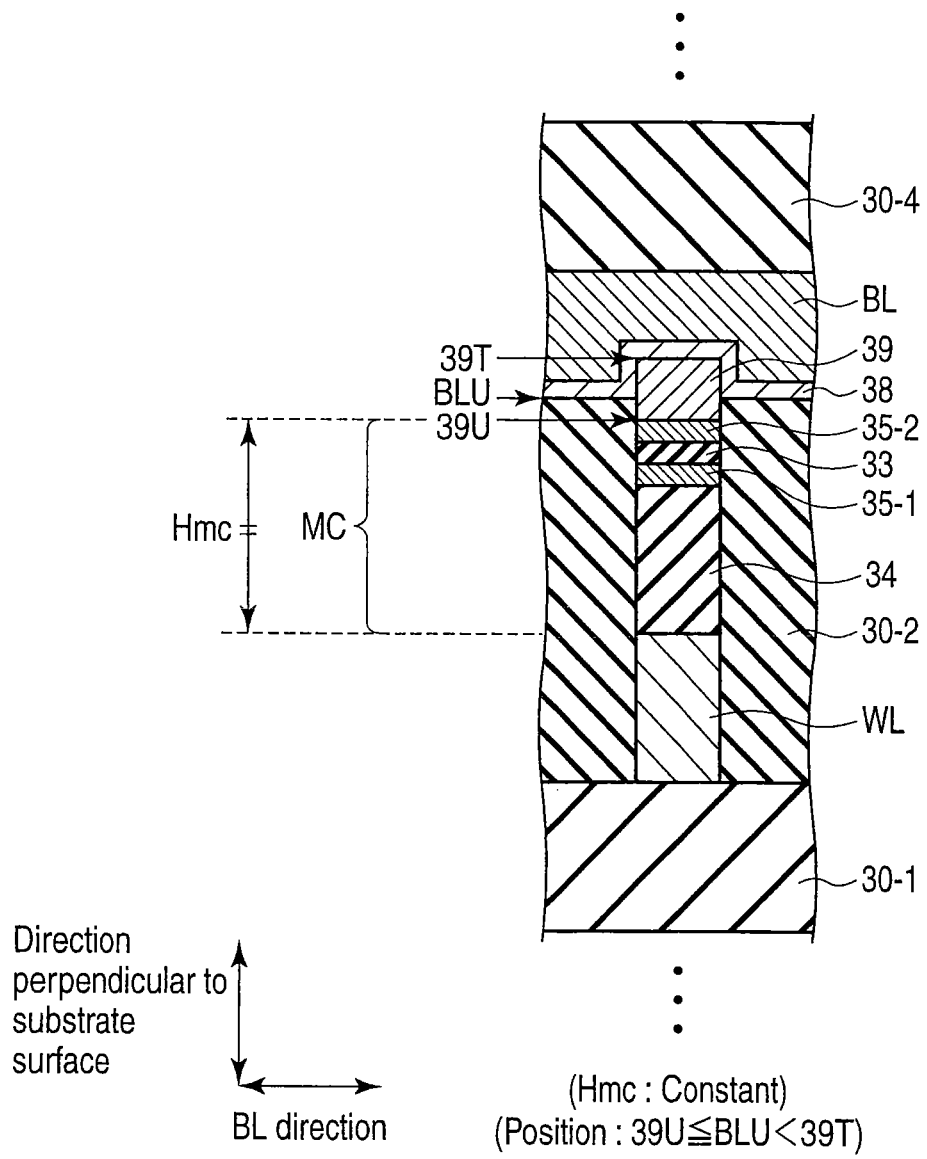
F I G. 1

Planar configuration example (first embodiment)

Sectional configuration example (first embodiment)

Manufacturing method (first embodiment)

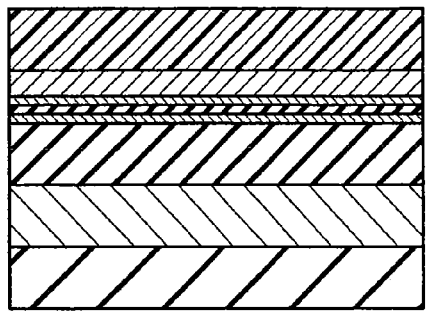
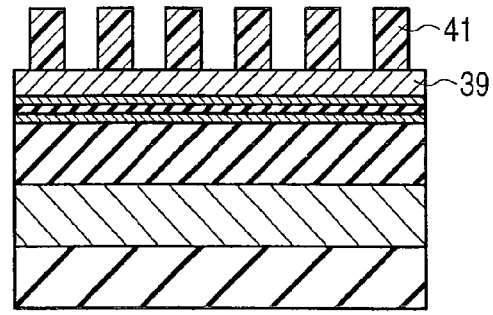
FIG.7A    FIG.7B
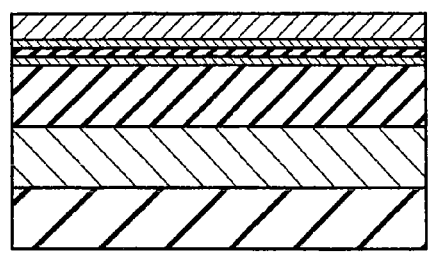
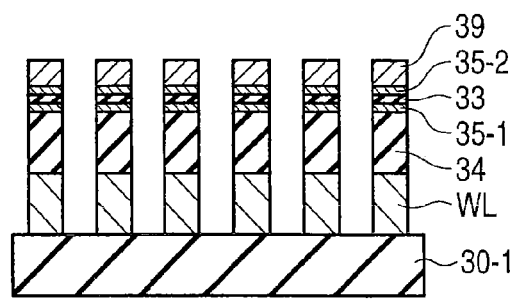
FIG.8A    FIG.8B
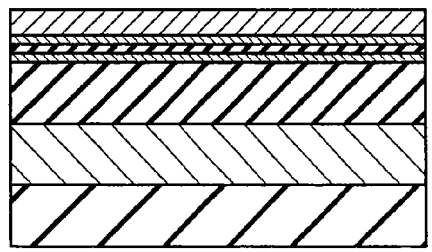
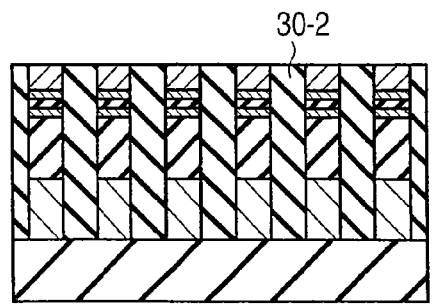
FIG.9A    FIG.9B

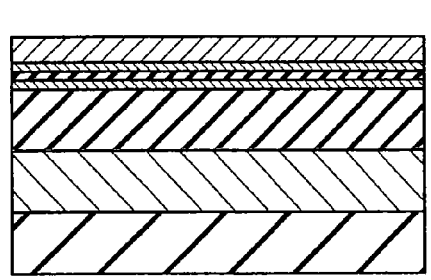
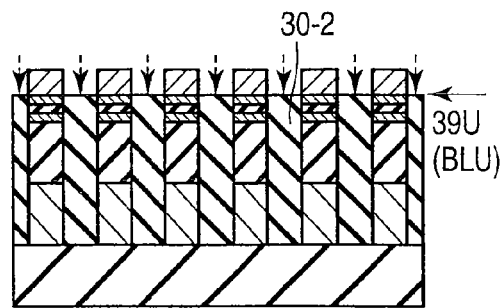
F I G. 1 0 A    F I G. 1 0 B
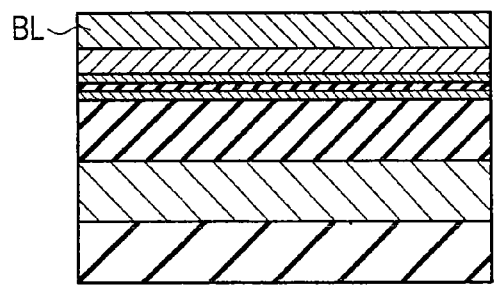
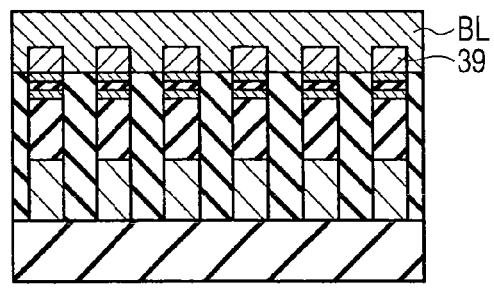
F I G. 1 1 A    F I G. 1 1 B
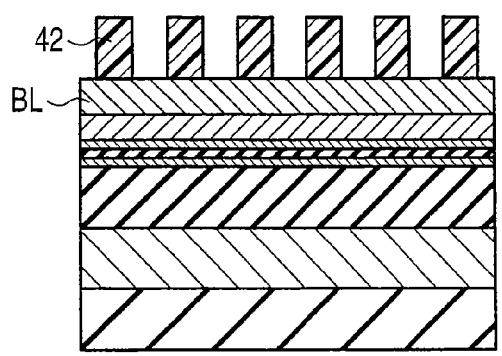
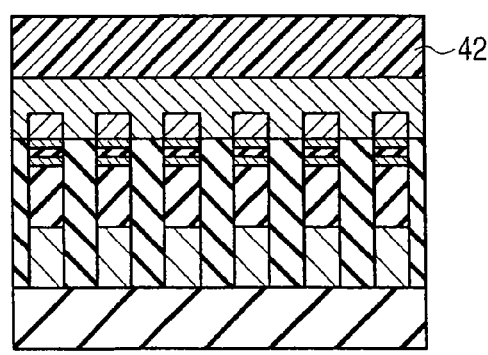
F I G. 1 2 A    F I G. 1 2 B

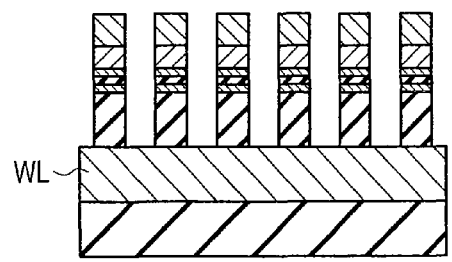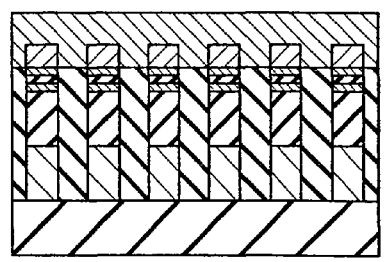
FIG.13A  FIG.13B
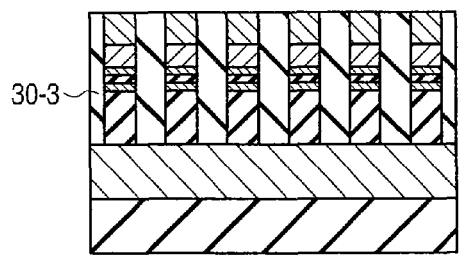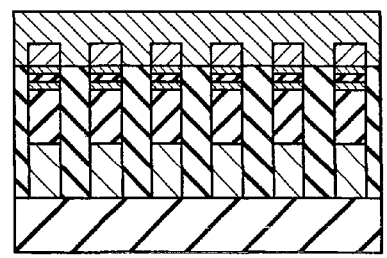
FIG.14A  FIG.14B
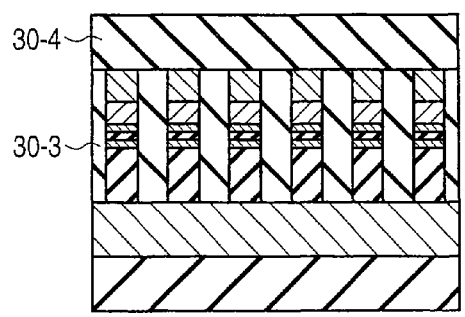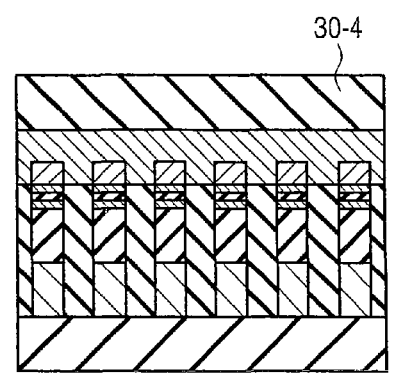
FIG.15A  FIG.15B Planar configuration example (second embodiment)

Manufacturing method (second embodiment)
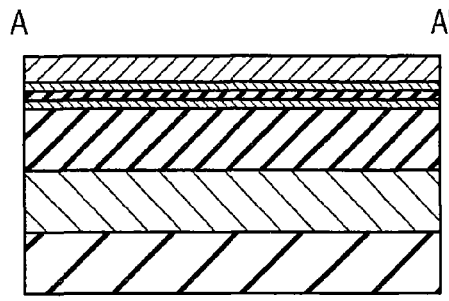
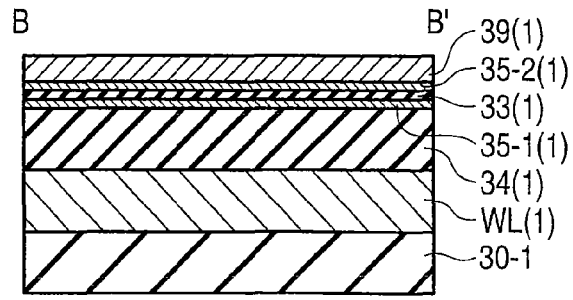
FIG.18A    FIG.18B
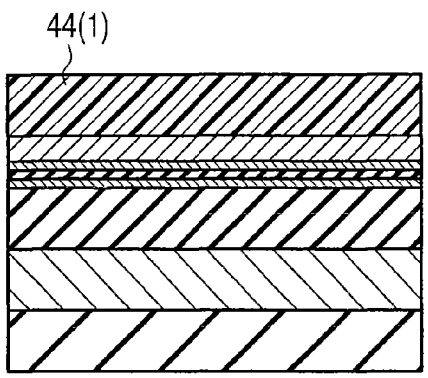
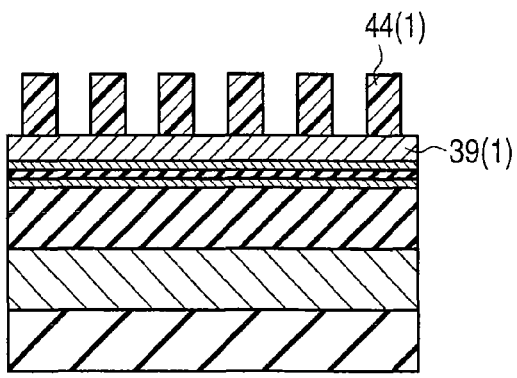
FIG.19A    FIG.19B
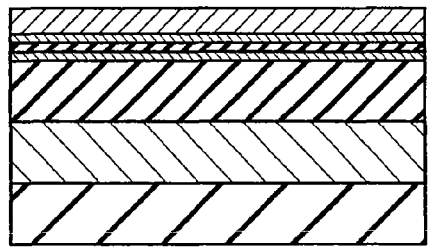
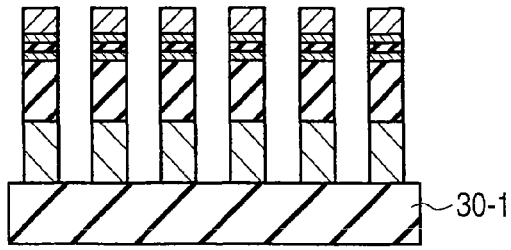
FIG.20A    FIG.20B

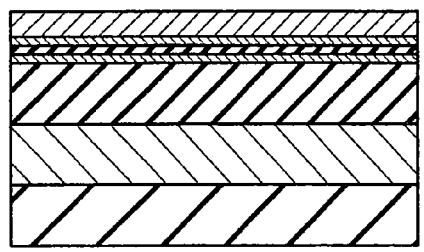 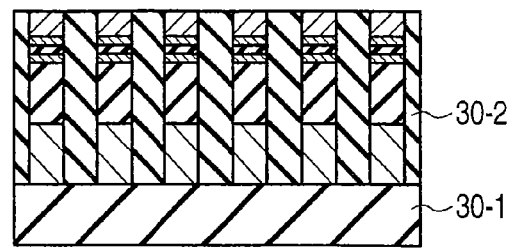
FIG. 21A     FIG. 21B
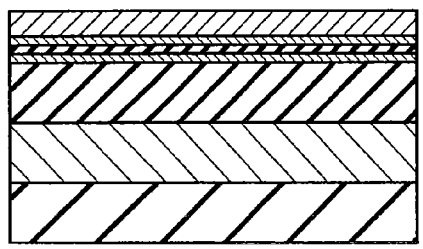 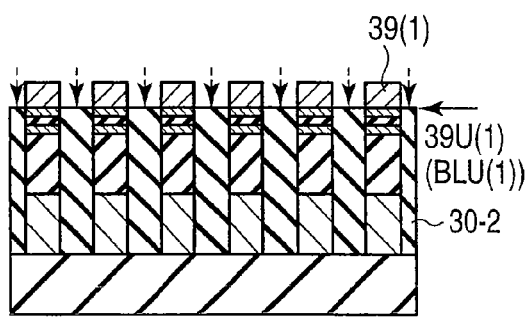
FIG. 22A     FIG. 22B
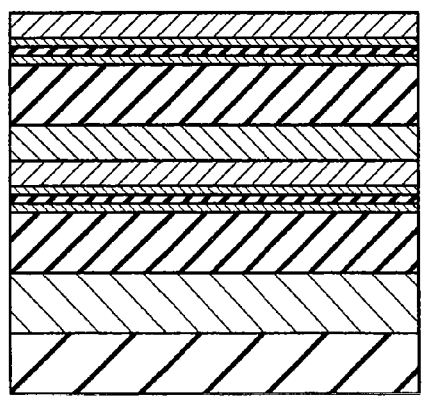 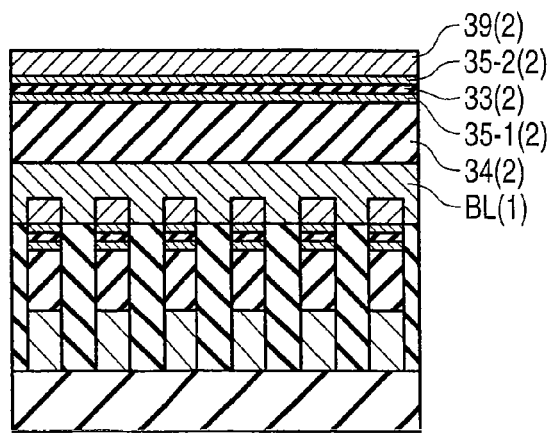
FIG. 23A     FIG. 23B

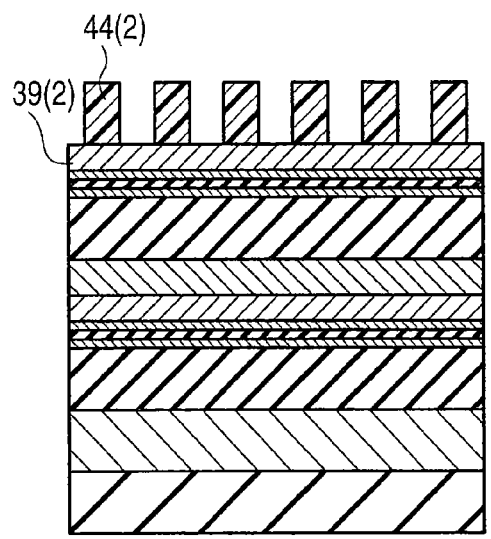
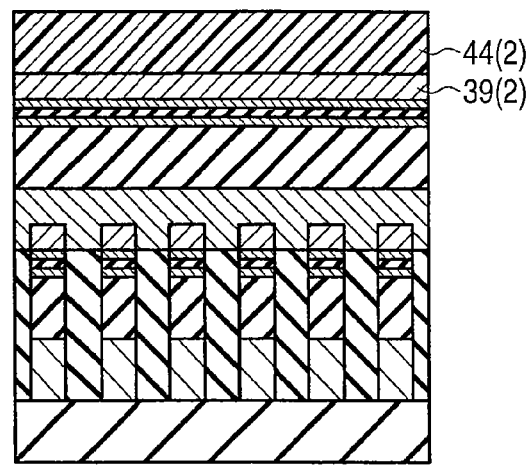
F I G. 2 4 A      F I G. 2 4 B
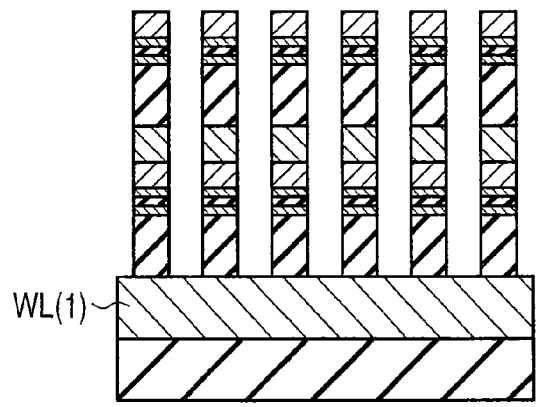
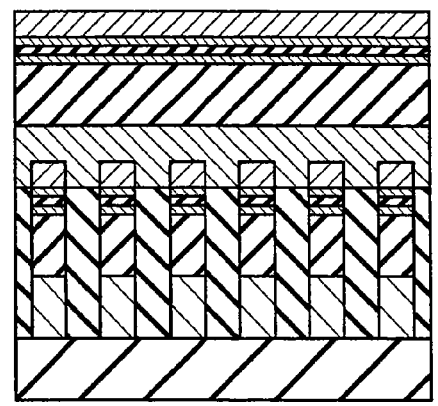
F I G. 2 5 A      F I G. 2 5 B

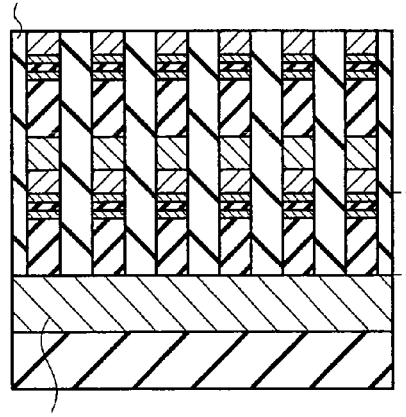
FIG. 26A     FIG. 26B
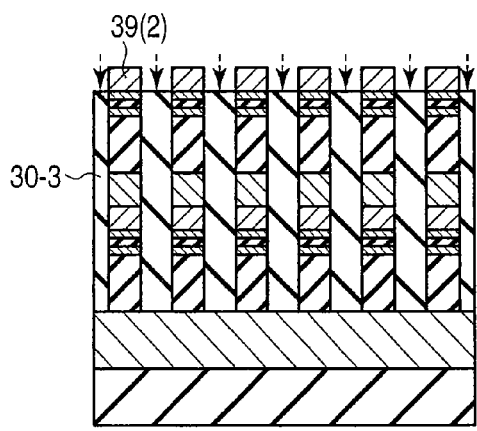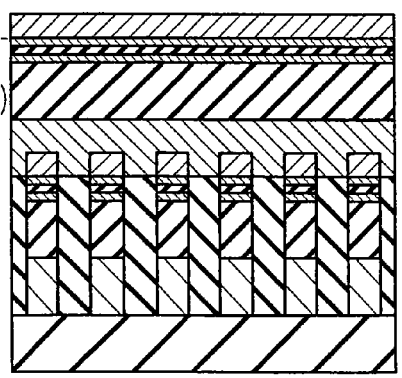
FIG. 27A     FIG. 27B

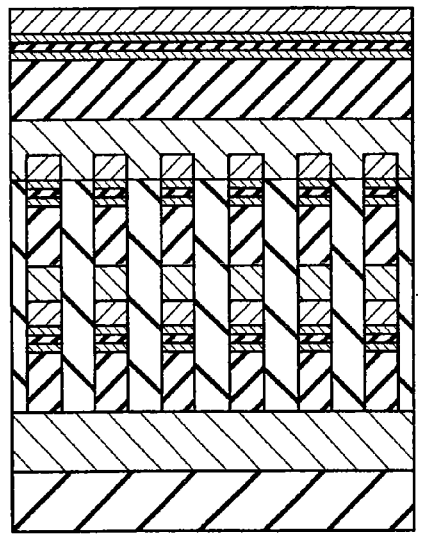
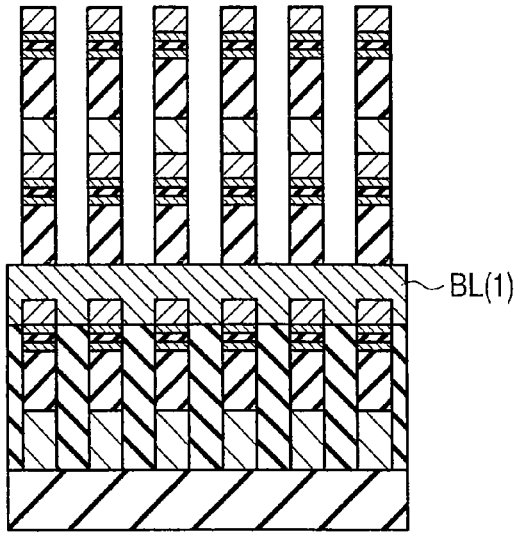
F I G. 3 0 A  F I G. 3 0 B
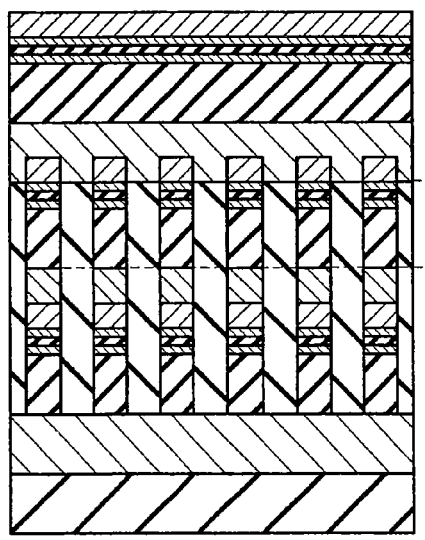
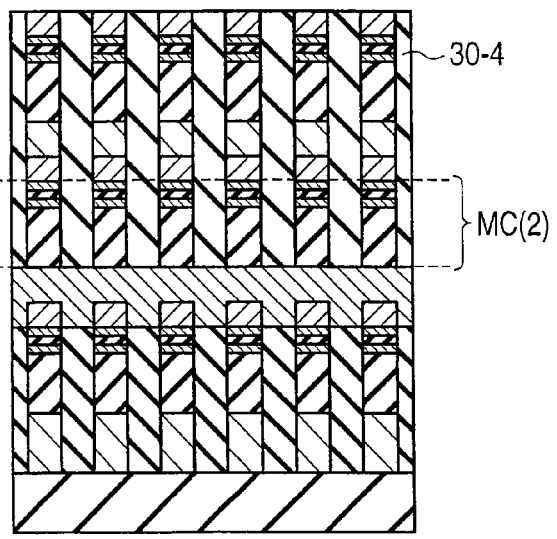
F I G. 3 1 A  F I G. 3 1 B

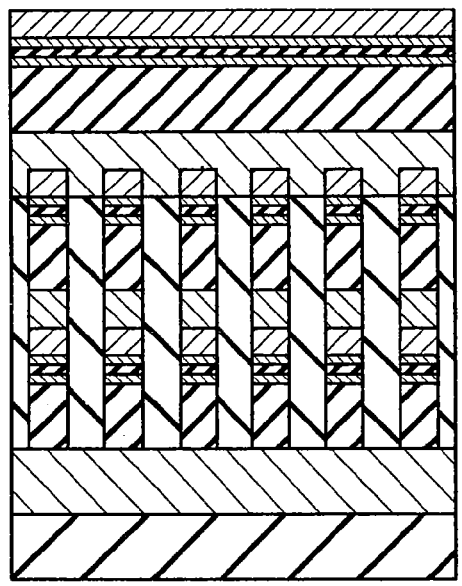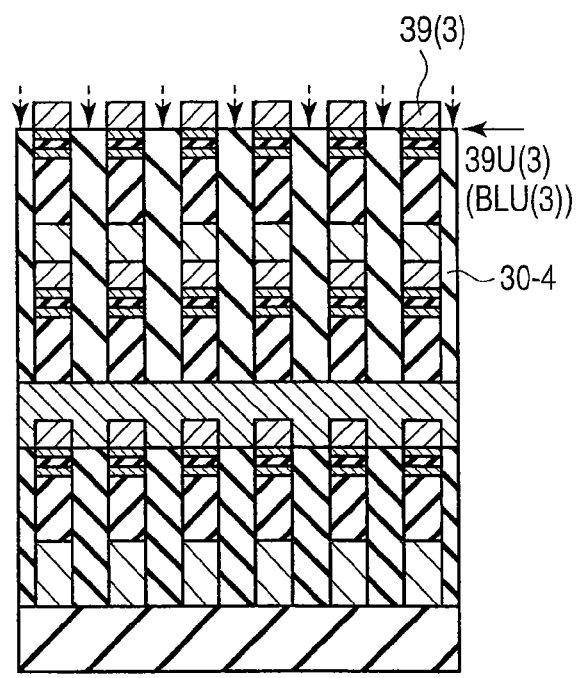
F I G. 3 2 A  F I G. 3 2 B

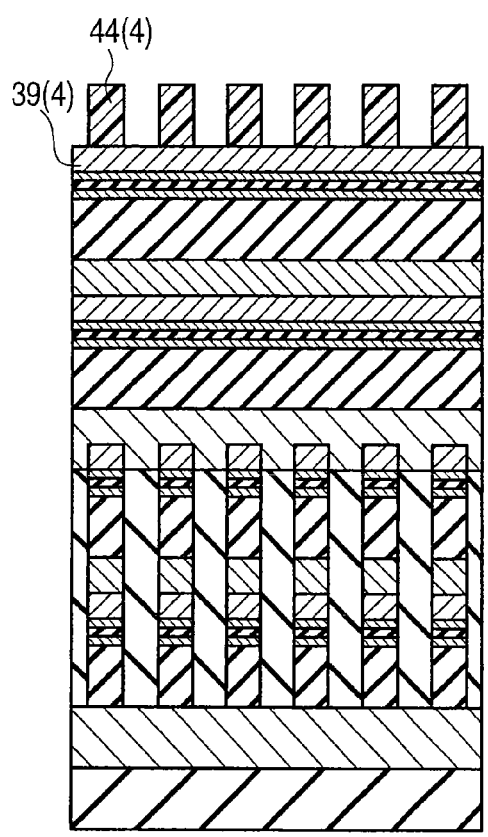 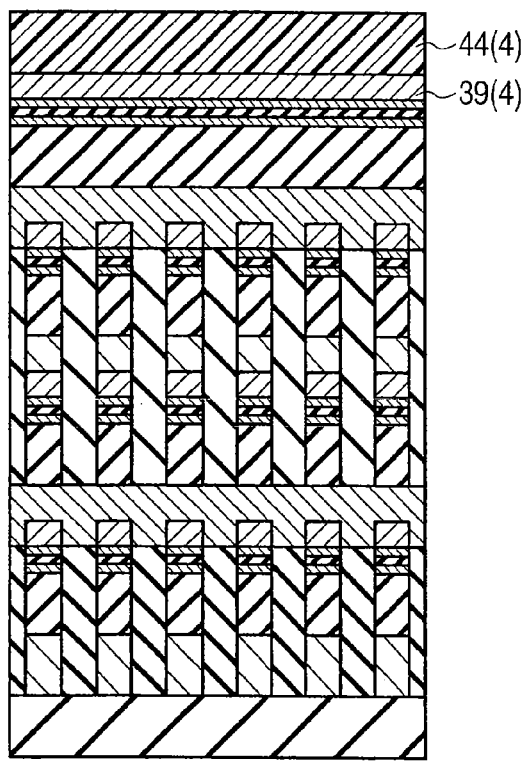
F I G. 3 4 A    F I G. 3 4 B

WL(2)
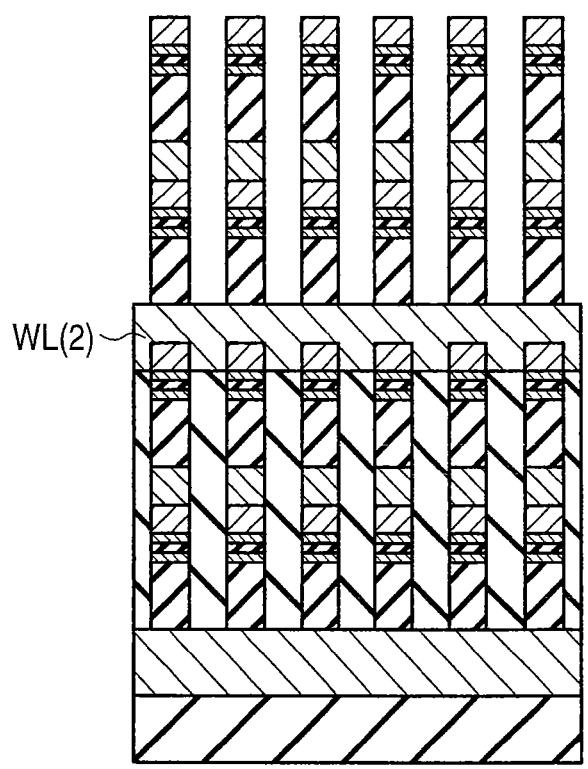
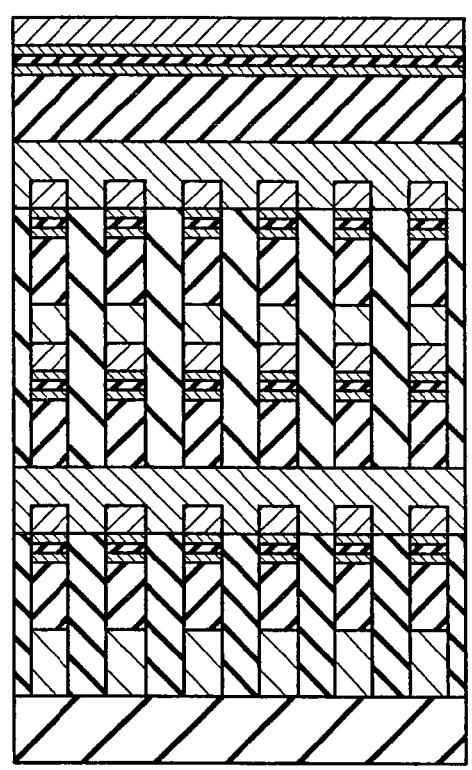
F I G. 3 5 A    F I G. 3 5 B

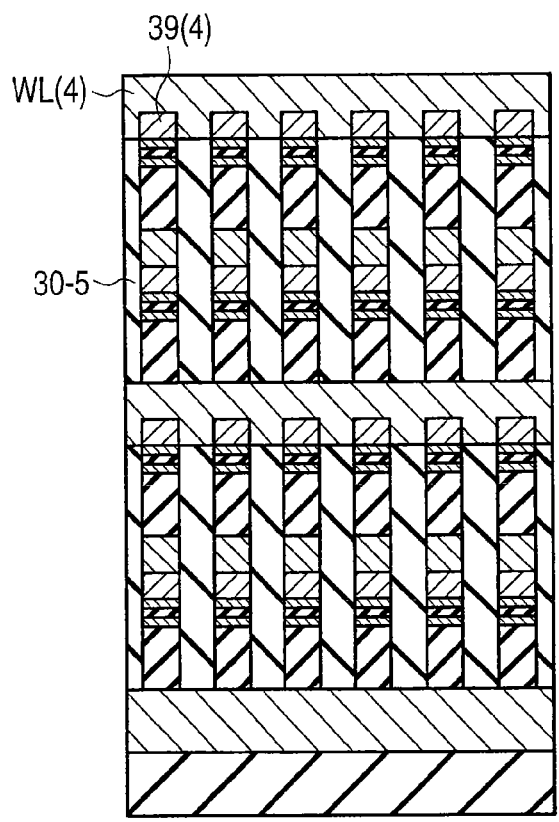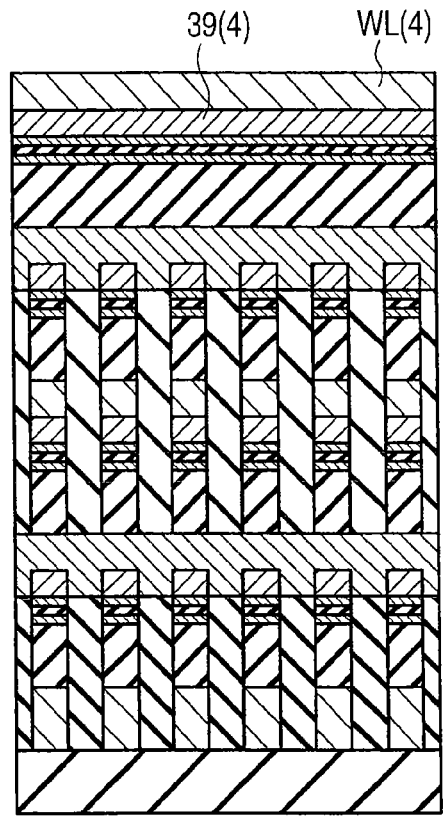
FIG. 38 A  FIG. 38 B

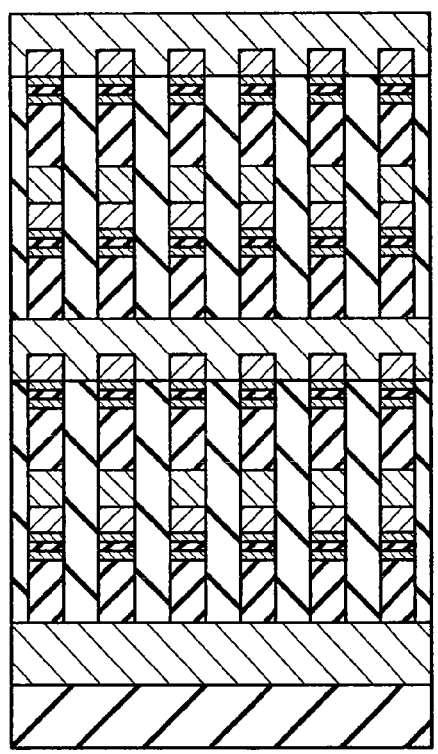 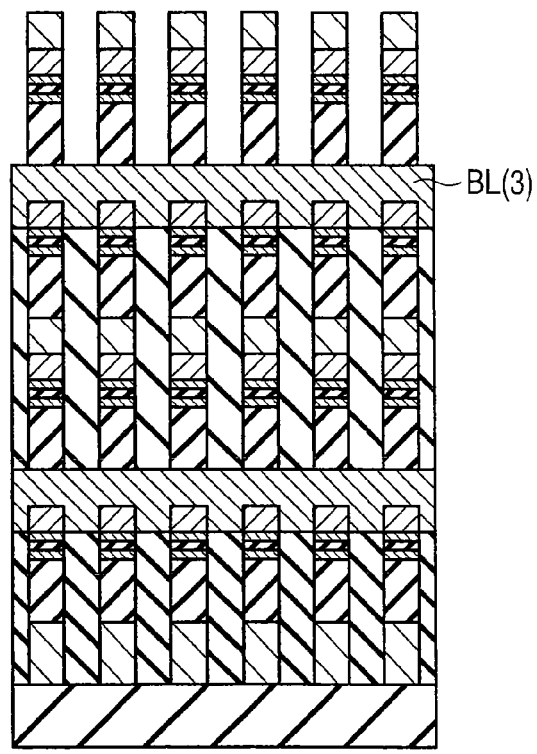
F I G. 40 A	F I G. 40 B

Planar configuration example (third embodiment)

Sectional configuration example (third embodiment)

Manufacturing method (third embodiment)
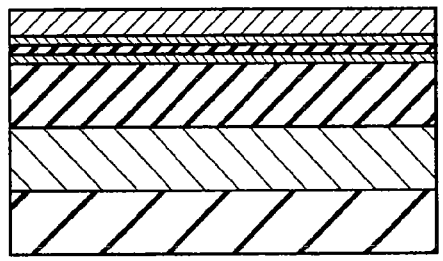
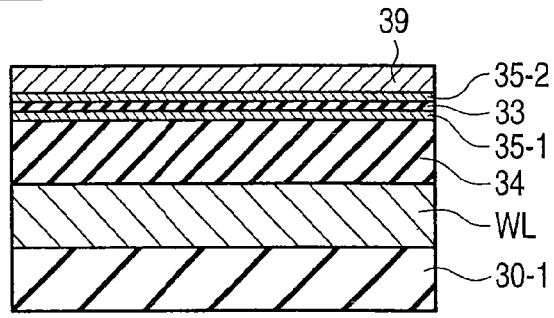
F I G. 45 A    F I G. 45 B
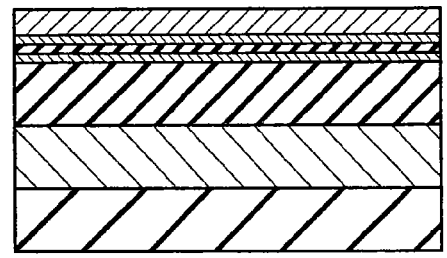
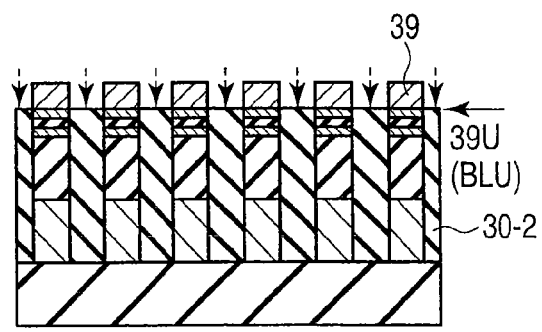
F I G. 46 A    F I G. 46 B
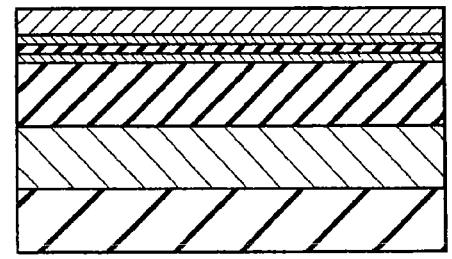
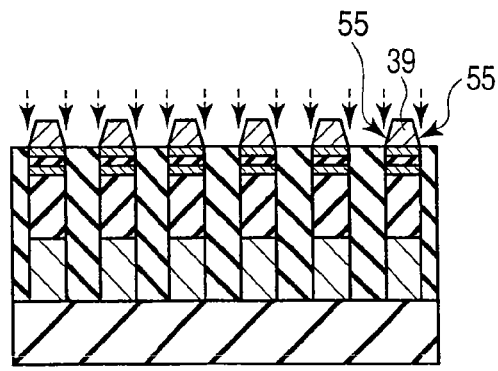
F I G. 47 A    F I G. 47 B Planar configuration example (fourth embodiment)

Manufacturing method (fourth embodiment)
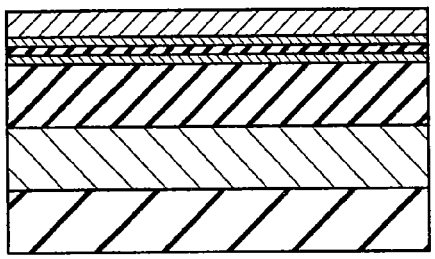
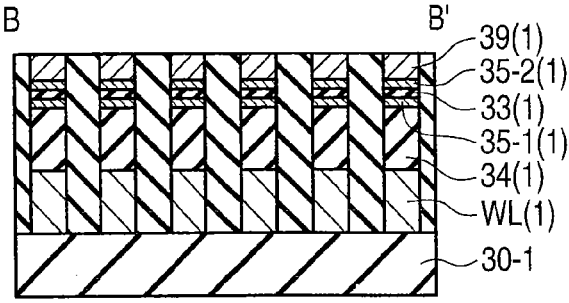
F I G. 51 A        F I G. 51 B
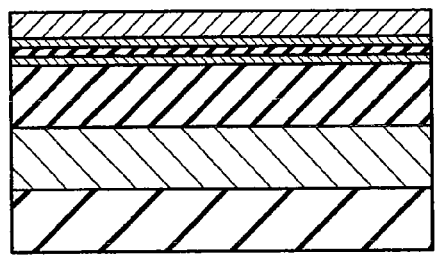
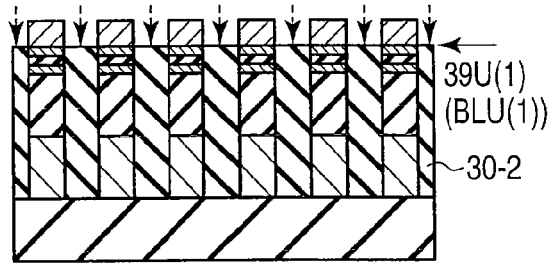
F I G. 52 A        F I G. 52 B
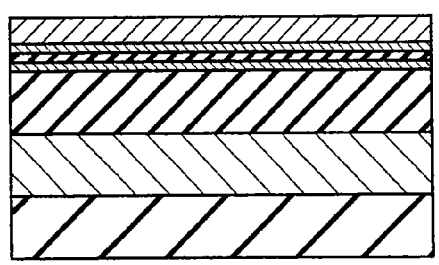
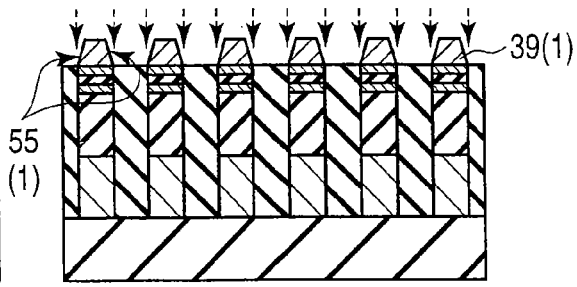
F I G. 53 A        F I G. 53 B

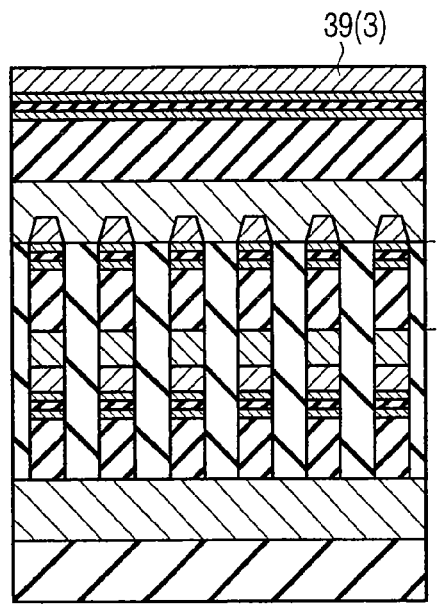
F I G. 5 6 A
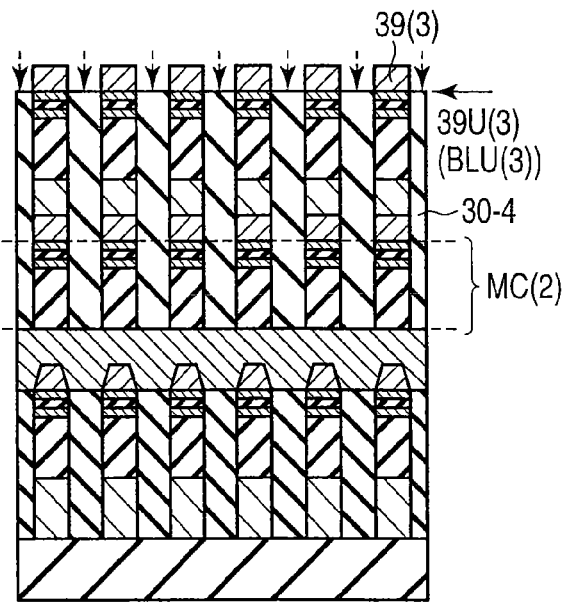
F I G. 5 6 B
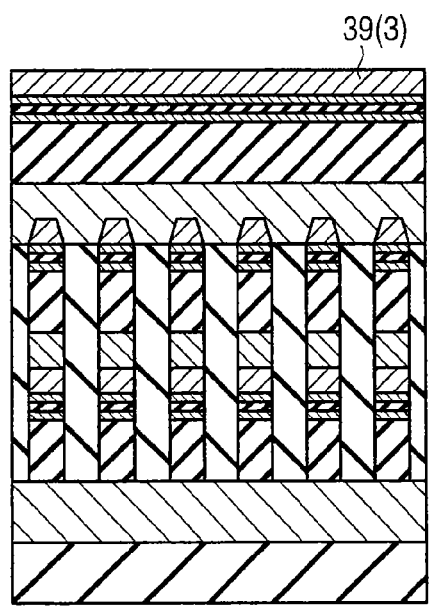
F I G. 5 7 A
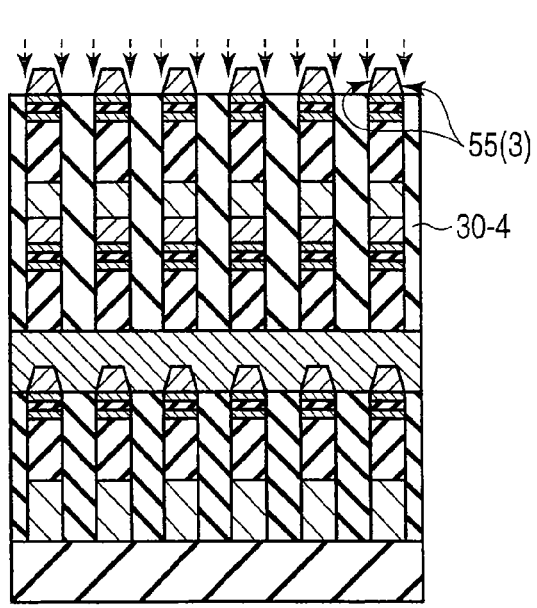
F I G. 5 7 B

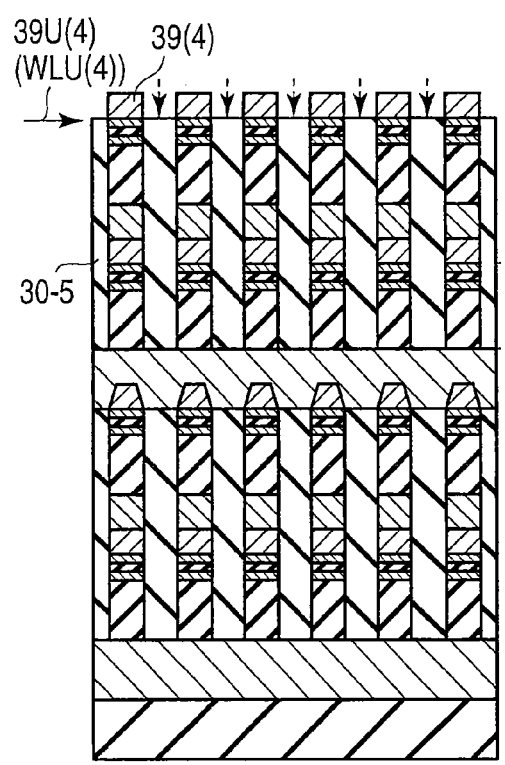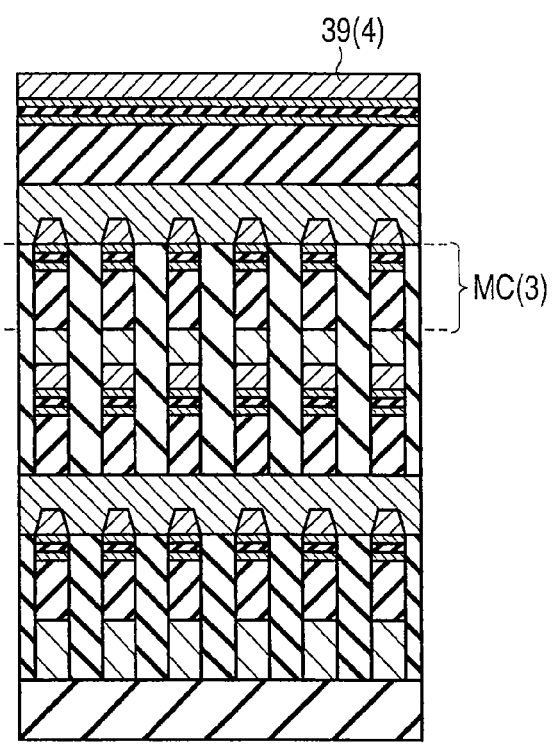
F I G. 5 8 A    F I G. 5 8 B

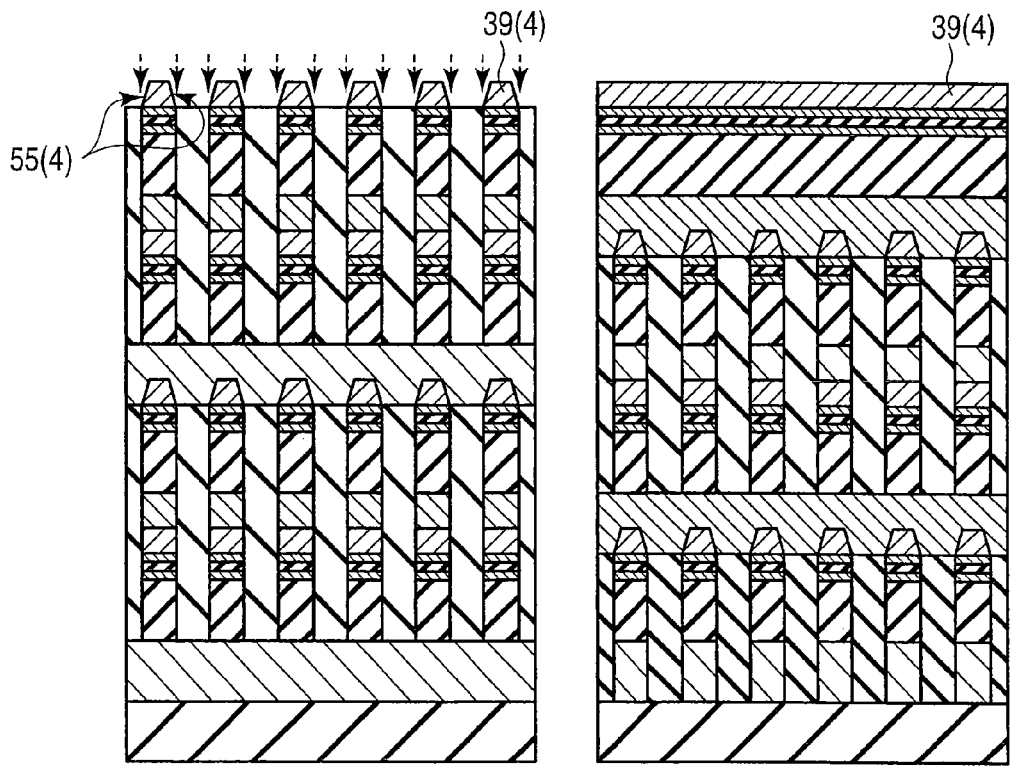
F I G. 5 9 A            F I G. 5 9 B
Planar configuration example (fifth embodiment)
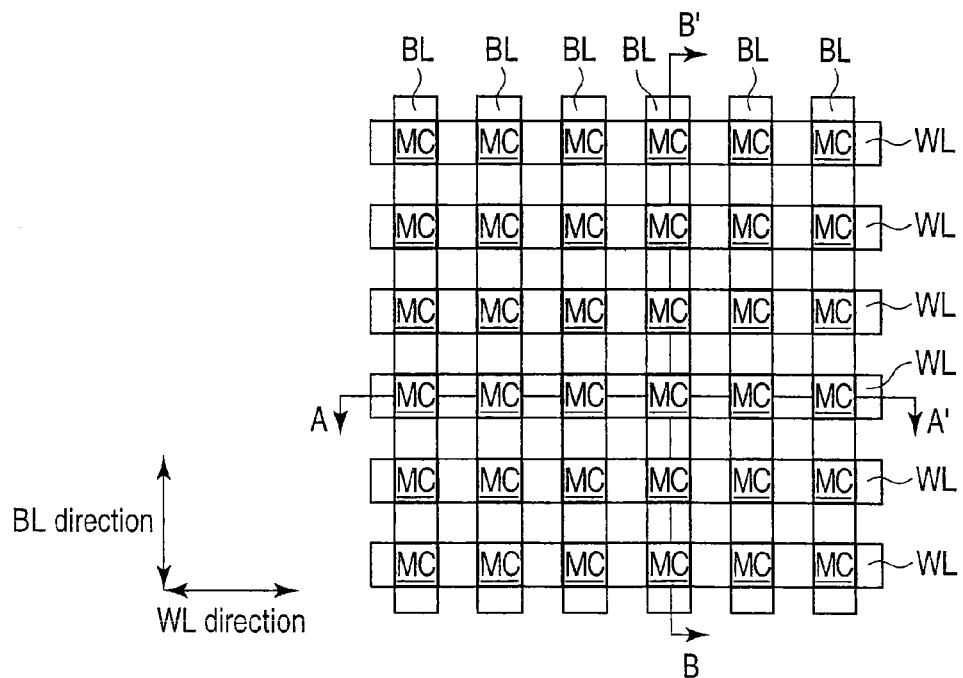
F I G. 6 0

Manufacturing method (fifth embodiment)

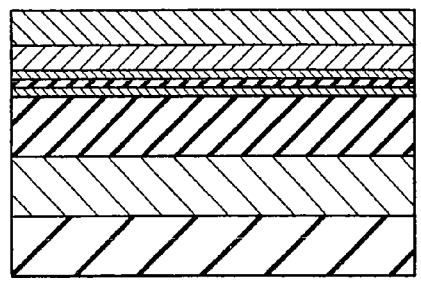
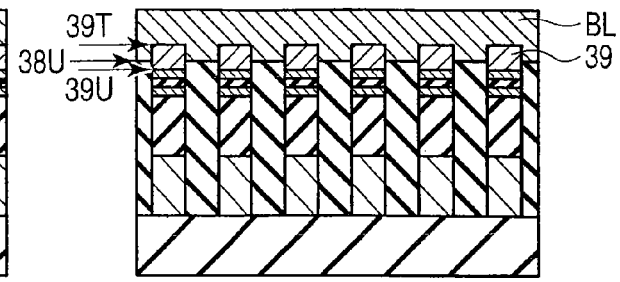
FIG. 65A    FIG. 65B
Planar configuration example (sixth embodiment)
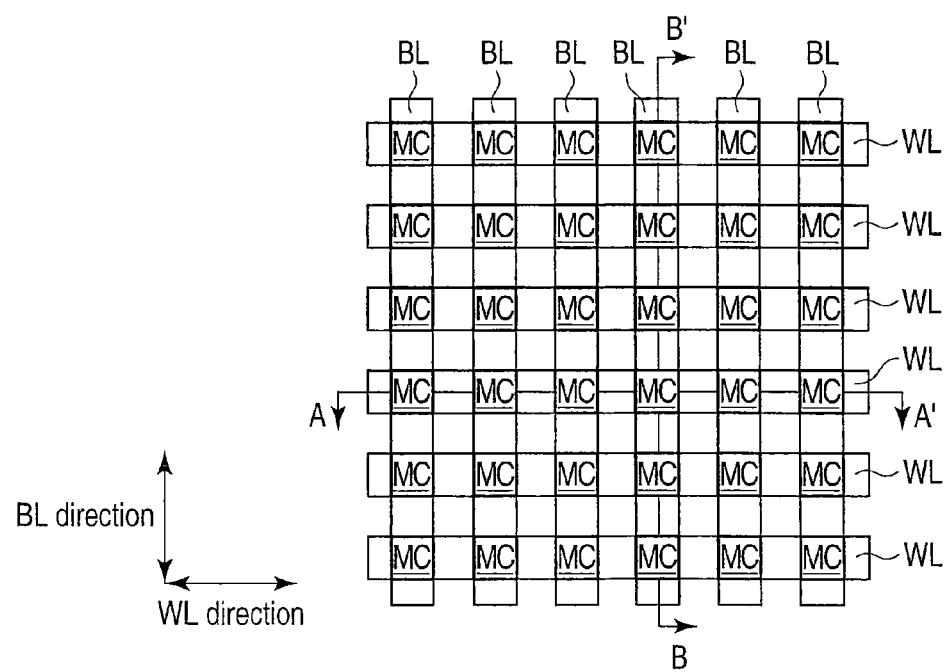
FIG. 66

Manufacturing method (sixth embodiment)

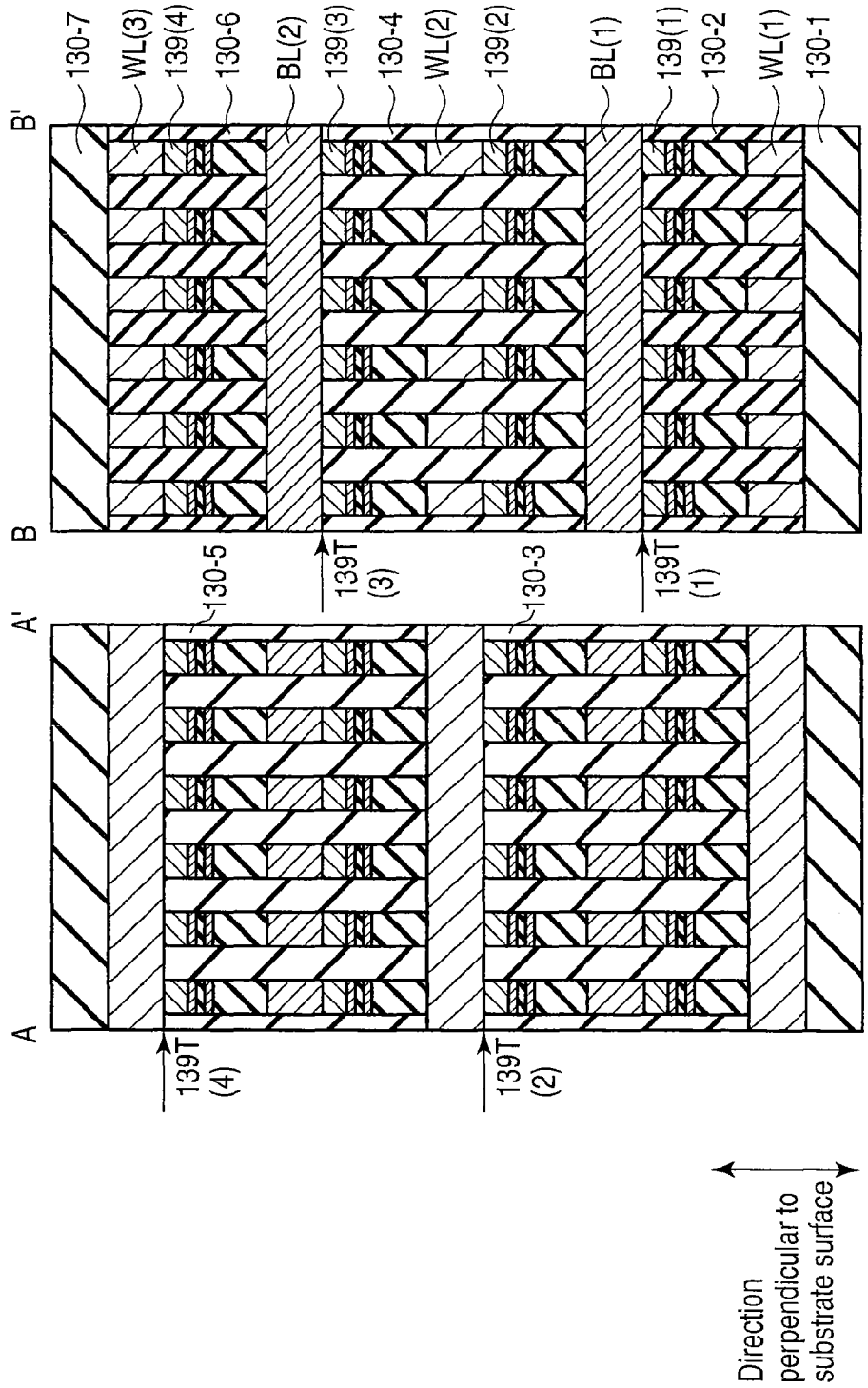

METHOD OF MANUFACTURING A SEMICONDUCTOR MEMORY DEVICE

CROSS-REFERENCE TO RELATED APPLICATIONS

This application is a divisional of U.S. application Ser. No. 12/879,281 filed Sep. 10, 2010, and is based upon and claims the benefit of priority from Japanese Patent Application No. 2009-218111, filed Sep. 18, 2009; the entire contents of each of which are incorporated herein by reference.

FIELD

Embodiments described herein relate generally to a semiconductor memory device and a method of manufacturing the semiconductor memory device.

BACKGROUND

In recent years, much attention has been paid to and much effort has been made to develop semiconductor memory devices with resistive semiconductor elements, for example, ReRAMs (Resistive RAM), PCRAMs (Phase Change RAMs), and MRAMs (Magnetic RAMs, Magneto-resistive RAMs), as well as Fuse/Anti-Fuse RAMS; these semiconductor memory devices are expected to serve as next-generation succession candidates for flash memories, which are high-capacity, inexpensive semiconductor memory devices.

BRIEF DESCRIPTION OF THE DRAWINGS

FIG. 1 is a sectional view illustrating an outline of a semiconductor memory device according to the present invention;

FIGS. 7A and 7B are sectional views showing a step of manufacturing the semiconductor memory device according to the first embodiment;

FIGS. 8A and 8B are sectional views showing a step of manufacturing the semiconductor memory device according to the first embodiment;

FIGS. 9A and 9B are sectional views showing a step of manufacturing the semiconductor memory device according to the first embodiment;

FIGS. 10A and 10B are sectional views showing a step of manufacturing the semiconductor memory device according to the first embodiment;

FIGS. 11A and 11B are sectional views showing a step of manufacturing the semiconductor memory device according to the first embodiment;

FIGS. 12A and 12B are sectional views showing a step of manufacturing the semiconductor memory device according to the first embodiment;

FIGS. 13A and 13B are sectional views showing a step of manufacturing the semiconductor memory device according to the first embodiment;

FIGS. 14A and 14B are sectional views showing a step of manufacturing the semiconductor memory device according to the first embodiment;

FIGS. 15A and 15B are sectional views showing a step of manufacturing the semiconductor memory device according to the first embodiment;

FIGS. 18A and 18B are sectional views showing a step of manufacturing the semiconductor memory device according to the second embodiment;

FIGS. 19A and 19B are sectional views showing a step of manufacturing the semiconductor memory device according to the second embodiment;

FIGS. 20A and 20B are sectional views showing a step of manufacturing the semiconductor memory device according to the second embodiment;

FIGS. 21A and 21B are sectional views showing a step of manufacturing the semiconductor memory device according to the second embodiment;

FIGS. 22A and 22B are sectional views showing a step of manufacturing the semiconductor memory device according to the second embodiment;

FIGS. 23A and 23B are sectional views showing a step of manufacturing the semiconductor memory device according to the second embodiment;

FIGS. 24A and 24B are sectional views showing a step of manufacturing the semiconductor memory device according to the second embodiment;

FIGS. 25A and 25B are sectional views showing a step of manufacturing the semiconductor memory device according to the second embodiment;

FIGS. 26A and 26B are sectional views showing a step of manufacturing the semiconductor memory device according to the second embodiment;

FIGS. 27A and 27B are sectional views showing a step of manufacturing the semiconductor memory device according to the second embodiment;

FIGS. 30A and 30B are sectional views showing a step of manufacturing the semiconductor memory device according to the second embodiment;

FIGS. 31A and 31B are sectional views showing a step of manufacturing the semiconductor memory device according to the second embodiment;

FIGS. 32A and 32B are sectional views showing a step of manufacturing the semiconductor memory device according to the second embodiment;

FIGS. 34A and 34B are sectional views showing a step of manufacturing the semiconductor memory device according to the second embodiment;

FIGS. 35A and 35B are sectional views showing a step of manufacturing the semiconductor memory device according to the second embodiment;

FIGS. 38A and 38B are sectional views showing a step of manufacturing the semiconductor memory device according to the second embodiment;

FIGS. 40A and 40B are sectional views showing a step of manufacturing the semiconductor memory device according to the second embodiment;

FIGS. 45A and 45B are sectional views showing a step of manufacturing the semiconductor memory device according to the third embodiment;

FIGS. 46A and 46B are sectional views showing a step of manufacturing the semiconductor memory device according to the third embodiment;

FIGS. 47A and 47B are sectional views showing a step of manufacturing the semiconductor memory device according to the third embodiment;

FIGS. 51A and 51B are sectional views showing a step of manufacturing the semiconductor memory device according to the fourth embodiment;

FIGS. 52A and 52B are sectional views showing a step of manufacturing the semiconductor memory device according to the fourth embodiment;

FIGS. 53A and 53B are sectional views showing a step of manufacturing the semiconductor memory device according to the fourth embodiment;

FIGS. 56A and 56B are sectional views showing a step of manufacturing the semiconductor memory device according to the fourth embodiment;

FIGS. 57A and 57B are sectional views showing a step of manufacturing the semiconductor memory device according to the fourth embodiment;

FIGS. 58A and 58B are sectional views showing a step of manufacturing the semiconductor memory device according to the fourth embodiment;

FIGS. 59A and 59B are sectional views showing a step of manufacturing the semiconductor memory device according to the fourth embodiment;

FIG. 60 is plan view showing an example of the planar configuration of the semiconductor memory device according to a fifth embodiment;

FIGS. 65A and 65B are sectional views showing a step of manufacturing the semiconductor memory device according to the fifth embodiment;

FIG. 66 is plan view showing an example of the planar configuration of the semiconductor memory device according to a sixth embodiment;

FIGS. 72A and 72B are sectional views illustrating an example of the configuration of a semiconductor memory device according to a comparative example.

DETAILED DESCRIPTION

Figure 2:
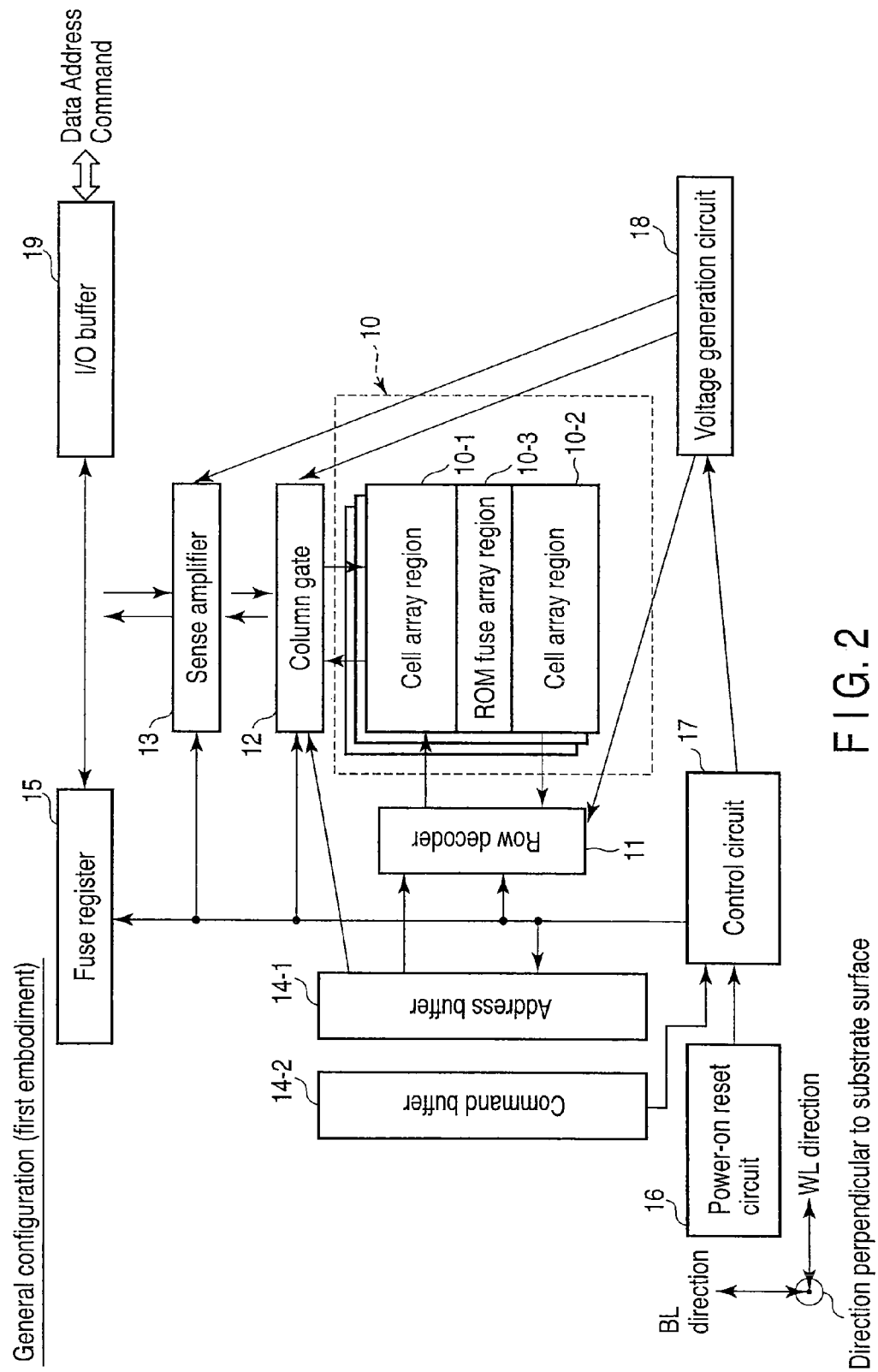
FIG. 2 is a system block diagram showing an example of the general configuration of a semiconductor memory device according to a first embodiment of the present invention.

In general, according to one embodiment, a semiconductor memory device includes a substrate, an upper-layer wire provided on the substrate, a lower-layer wire provided on the substrate, a memory cell located at an intersection of the upper-layer wire and the lower-layer wire and comprising a diode and a storage layer, a conductive layer located between the upper-layer wire and the memory cell in a direction perpendicular to the substrate surface, and an interlayer insulating film provided between memory cells, wherein a position of an interface between the upper-layer wire and the interlayer insulating film is lower than a top surface of the conductive layer.

Here, for example, in a three-dimensional (3D) cross point ReRAM that uses a resistance varying element, a conductive layer is located between an upper wire and a memory cell.

However, the thickness of the conductive layer tends to increase an element height in a direction perpendicular to a substrate surface. This tendency becomes more significant as the number of stacked layers containing memory cells increases (4 layers, 8 layers, 16 layers, . . . , etc.).

Thus, embodiments will be described below with reference to the drawings. ReRAM (Resistive Random Access Memory) will be described as an example of a semiconductor memory device. However, the present invention is not limited to this type of semiconductor memory device. In the description, the same components are denoted by the same reference numerals throughout the drawings.

[Outline]

First, a semiconductor memory device according to an outline of the embodiments will be described with reference to FIG. 1.

In an example of the present invention, a semiconductor memory device and a method of manufacturing the semiconductor device are proposed which device and method are advantageous for shrinking in a direction perpendicular to the substrate surface of the semiconductor memory device.

The semiconductor memory device is configured as follows. For example, as shown in FIG. 1, the semiconductor memory device comprises an upper wire BL, a lower wire WL, a plurality of memory cells MC each arranged at the intersection of the upper wire BL and the lower wire WL and comprising a diode 34 and a storage layer 33, an interlayer insulating film 30-2 provided between the plurality of memory cells MC, and a conductive layer 39 provided between the upper wire BL and the memory cell MC in the direction perpendicular to the substrate surface of the semiconductor memory device. The position (BLU) of the interface between the upper wire BL and the interlayer insulating film 30-2 is lower than the top surface (39T) of the conductive layer. The position (BLU) is as high as or higher than the bottom surface (39U) of the conductive layer (39U≤BLU<39T). In other words, the interface (the bottom surface of the upper wire BL) between the upper wire BL and the interlayer insulating film 30-2 is placed at the position between the bottom surface and top surface of the conductive layer (39U≤BLU<39T).

In the above-described configuration, the position (BLU) of the interface between the upper wire BL and the interlayer insulating film 30-2 is lower than the top surface (39T) of the conductive layer. The position (BLU) is as high as or higher than the bottom surface (39U) of the conductive layer (39U≤BLU<39T). Thus, with regard to the height in the direction perpendicular to the substrate surface of the semiconductor memory device, the height of the semiconductor memory device can be reduced by an amount equal to the difference in height between the top surface of the conductive layer 39 and the interface (BLU).

Thus, this configuration enables a reduction in the element area in the direction perpendicular to the substrate surface. This is advantageous for shrinking in a direction perpendicular to the substrate surface of the semiconductor memory device. The above-described configuration also has the following advantage. Even if the upper-layer memory cell MC is processed together with the wiring layer 39 and the lower-layer memory cell (not shown in the drawings), an aspect ratio can be reduced by using the conductive layer 39 as a stopper film serving to prevent the memory cells MC from being damaged and to allow the lower-layer wire WL to be appropriately buried. This advantageous effect becomes more significant as the number of stacked layers containing memory cells increases (4, 8, 16, . . . , etc.).

Even in the above-described configuration, the height (film thickness) Hmc of the memory cell MC (the diode 34, the storage layer 33, and a lower conductive layer 35-1 and an upper conductive layer 35-2) can be maintained constant. It is not need to reduce the height Hmc of the memory cell MC to reduce an aspect ratio in the direction perpendicular to the substrate surface.

First Embodiment

An Example in which a Single Layer of Cell Array is Provided and in which the Bottom Surface of the Conductive Layer is Flush with the Bottom Surface of a Bit Line Now, a semiconductor memory device and a method of manufacturing the semiconductor memory device according to a first embodiment will be described with reference to FIG. 2 to FIG. 15. In the present example, a single layer (one layer) of cell array is provided, and the bottom surface 39U of the conductive layer is flush with the bottom surface BLU of a bit line BL.

1. Configuration Example 1.1 General Configuration Example

First, an example of the general configuration of a semiconductor memory device according to the first embodiment will be described with reference to FIG. 2.

As shown in FIG. 2, the semiconductor memory device according to the present example comprises a memory cell array 10, a row decoder 11, a column gate 12, a sense amplifier 13, an address buffer 14-1, a command buffer 14-2, a fuse register 15, a power-on reset circuit 16, a control circuit 17, a voltage generation circuit 18, and an I/O buffer 19.

The memory cell array 10 comprises cell array regions 10-1 and 10-2 each including a plurality of bit lines and a plurality of cross point memory cells arranged at the respective intersections of the bit lines in a matrix, and a ROM fuse array region 10-3. Furthermore, the memory cell arrays 10 may have a three-dimensional structure in which a plurality of layers of memory cell arrays are stacked in the direction perpendicular to the substrate surface of the semiconductor substrate. However, in the present example, an example in which a single layer (one layer) of memory cell array is provided will first be described. A three-dimensional structure in which a plurality of layers are stacked will be described below (a second embodiment and a fourth embodiment).

The row decoder 11 decodes addresses in a row direction (WL line direction). Furthermore, the row decoder 11 comprises a drive circuit configured to drive word lines.

The column gate 12 decodes addresses in a column direction (BL line direction). Furthermore, the column gate 12 comprises a drive circuit configured to drive bit lines. In the present example, although not shown in the drawings, the column gate 12 may be located on each of the upper and lower sides of the memory cell array 10.

The sense amplifier 13 is electrically connected to the column gate 12 and bit lines to read data from the memory cells. Similarly, in the present example, although not shown in the drawings, the sense amplifier 13 may be located on each of the upper and lower sides of the memory cell array 10.

The address buffer 14-1 is electrically connected to the row decoder 11 and the column gate 12 to temporarily hold row addresses and column addresses.

The command buffer 14-2 is electrically connected to the control circuit 17 to temporarily hold control commands.

The fuse register 15 is electrically connected to the I/O buffer 19 via a data bus line to hold, for example, required data such as management data.

The power-on reset circuit 16 senses power-on of the device to output a reset signal to the control circuit 17.

The voltage generation circuit 18 is electrically connected to the row decoder 11, the column gate 12, and the sense amplifier 13 to supply these circuits with required voltages under the control of the control circuit 19.

The I/O buffer 19 is electrically connected to the sense amplifier 13 and the fuse register 15 via a data bus line to temporarily hold data, addresses, and commands from an external apparatus such as a host apparatus.

The control circuit 17 controls the above-described circuits. For example, the control circuit 17 controls the above-described circuits to perform data write, data read, and data erase as described below.

1-2. Circuit Configuration of the Cell Array

Figure 3:
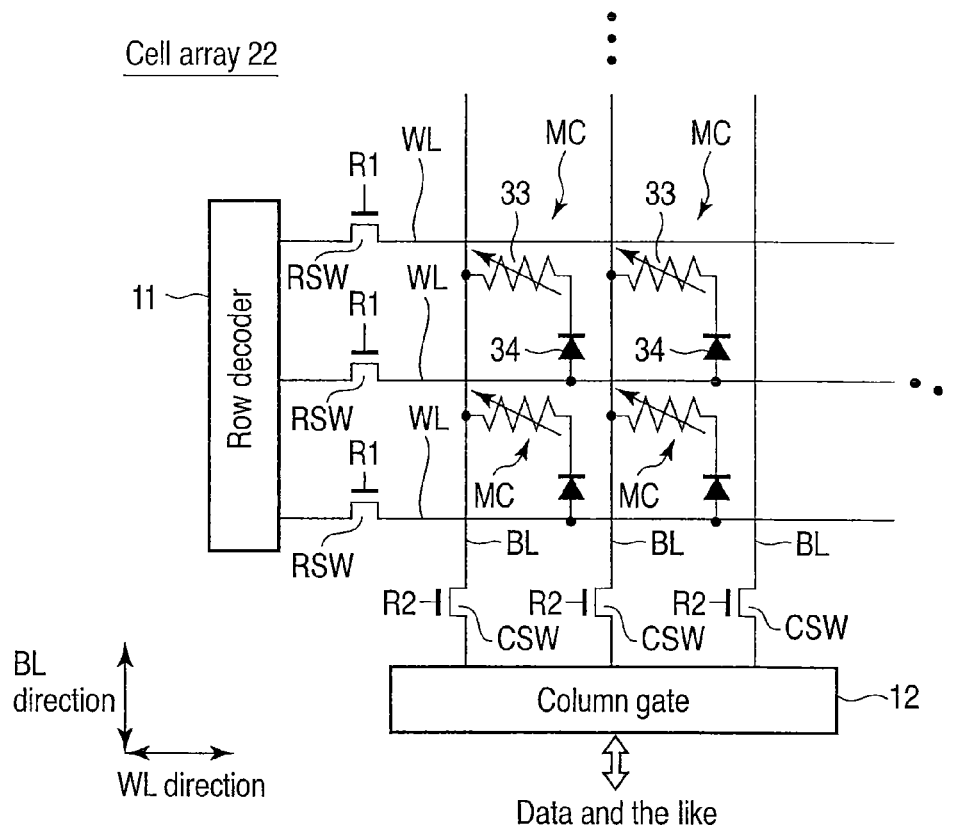
FIG. 3 is an equivalent circuit diagram showing an example of the configuration of a cell array according to the first embodiment.

Now, the circuit configuration of the cell array according to the present example will be described with reference to FIG. 3. As shown in FIG. 3, the cell array according to the present example comprises a plurality of cross point memory cells MC arranged at the respective intersections of a plurality of bit lines BL and word lines WL in a matrix.

Each of the memory cells MC comprises the storage layer 33 that is a variable resistance element and the diode 34. One end of a current path in the variable resistance element 33 is connected to the bit line BL. The other end of the current path is connected to a cathode of the diode 34. An anode of the diode 34 is connected to the word line WL.

One end of the word line WL is connected to the row decoder 11 via a MOS transistor RSW serving as a select switch. One end of the bit line BL is electrically connected to the column gate 12 via a MOS transistor CSW serving as a select switch.

A select signal R1 is input to a gate of the MOS transistor RSW in order to select one word line (row). A select signal R2 is input to a gate of the MOS transistor CSW in order to select one bit line (column).

1-3. Examples of Planar and Sectional Configurations of the Cell Array

1-3-1. Example of Planar Configuration of the Cell Array

Figure 4:
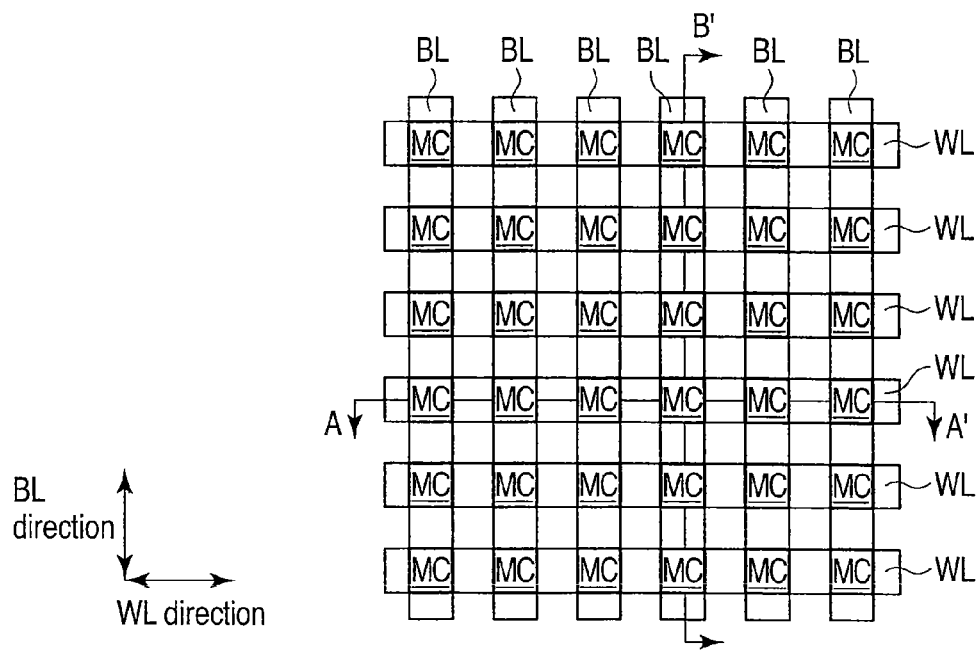
FIG. 4 is a plan view showing an example of the planar configuration of the semiconductor memory device according to the first embodiment.

An example of the planar configuration of the cell array according to the present example is shown in FIG. 4.

As shown in FIG. 4, a plurality of word lines WL (WL direction) are arranged orthogonally to a plurality of bit lines BL (BL direction).

The memory cells MC are arranged at the respective intersections of the word lines WL and the bit lines BL in a matrix.

1-3-2. Example of Sectional Configuration of the Cell Array

Figures 5A, 5B:
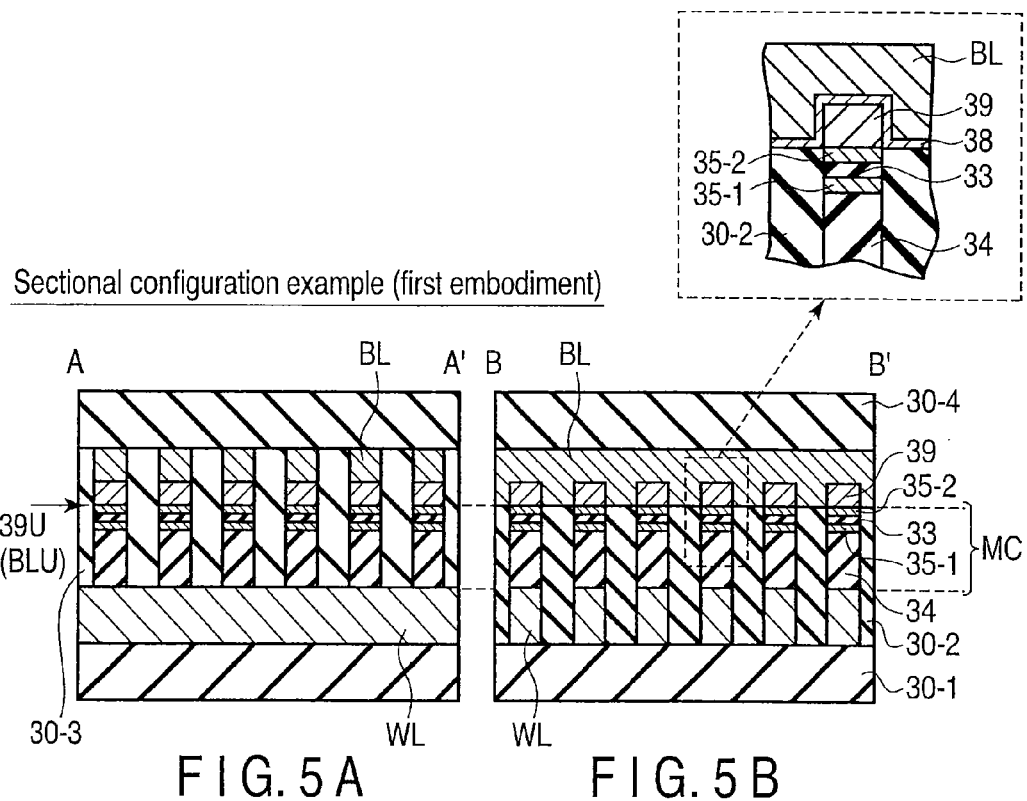
FIG. 5A is a sectional view taken along line A-A' in FIG. 4.
FIG. 5B is a sectional view taken along line B-B' in FIG. 4.

An example of sectional configuration of the cell array according to the present example is shown in FIGS. 5A and 5B. FIG. 5A is a sectional view taken along line A-A' in FIG. 4. FIG. 5B is a sectional view taken along line B-B' in FIG. 4.

As shown in FIGS. 5A and 5B, the bit lines BL extend continuously in the BL direction. The word lines WL extend continuously in the WL direction. The plurality of memory cells MC are arranged at the respective intersections of the bit lines BL and the word lines WL. Interlayer insulating films 30-1 to 30-4 are each provided between the memory cells MC to separate the memory cells MC from each other. Furthermore, the top surface of each of the interlayer insulating films 30-2 to 30-3 is in contact with the bit line BL. The bottom surface of each of the interlayer insulating films 30-2 to 30-3 is in contact with the word line WL.

The conductive layer 39 is located between the memory cell MC and the bit line BL in the direction perpendicular to the substrate surface. In the present example, a single layer (one layer) of cell array is provided, and the bottom surface (39U) of the conductive layer 39 almost coincides with (is almost flush with) the boundary between the bit line BL and the interlayer insulating film 30-2 and 30-3. Furthermore, the conductive layer 39 functions as a part of the bit line BL. The conductive layer 39 is formed of, for example, tungsten (W).

In the above-described configuration, the bottom surface of the bit line BL on the interlayer insulating film 30-2 and 30-3 is located below the top surface of the conductive layer 39. Thus, the side surface of the conductive layer 39 is in contact with the bit line BL. That is, conductive layer 39 is a part of the bit line (upper-layer wire) BL. As a result, the film thickness of the conductive layer 39 can almost be prevented from contributing to the height in the direction perpendicular to the substrate surface of the semiconductor memory device. Hence, the configuration is most advantageous for a reduction in film thickness in the direction perpendicular to the substrate surface. Furthermore, as described below, in connection with formation of the bit line (upper-layer wire) BL and the memory cell MC, the aspect ratio in the direction perpendicular to the substrate surface (vertical direction) can be reduced.

The memory cell MC is configured such that the diode 34, the lower electrode 35-1, the storage layer 33, and the upper electrode 35-2 are sequentially stacked between the word line WL and the bit line BL. A barrier metal layer (38) shown in FIG. 1 is omitted from the other figures if there is no specification. At this time, the barrier metal layer 38 is included in word line WL.

The word line WL and the bit line BL are both formed of, for example, tungsten (W), aluminum (Al), or copper (Cu), or a stack film of barrier metal (WN) and any of tungsten, aluminum, and copper.

One end of the diode 34 is connected to the word line. The other end of the diode 34 is electrically connected to the lower electrode 35-1. For example, the diode 34 is formed of amorphous silicon, polysilicon, and the like by sequentially stacking an N-type layer, an intrinsic layer, and a P-type layer.

The lower electrode 35-1 is provided on the diode 34 so that the storage layer 33 is sandwiched between the lower electrode 35-1 and the upper electrode 35-2. The lower electrode 35-1 and the upper electrode 35-2 are formed of, for example, titanium nitride.

The storage layer 33 is a variable resistance element with its resistance varied by a potential difference provided by the word line WL and the bit line BL. The storage layer 33 is composed of, for example, metal oxide.

2. Operation Example

2-1. Data Write Operation (Information Recording/Setting Operation

Now, a data write operation performed on the memory cell MC will be described in brief.

To allow data to be written to the memory cell MC, a voltage may be applied to the storage layer (variable resistance element) 33 in the selected memory cell MC to generate a voltage gradient in the selected variable resistance element 33. Then, current flows through the variable resistance element 33. For example, the potential of the word line WL is set relatively lower than that of the bit line. Given that the bit line BL is at a fixed potential (for example, about 3 V), a ground potential may be applied to the word line.

In the data write operation, all of the unselected word lines WL and unselected bit lines BL are preferably biased to the same potential. Furthermore, during standby before the data write operation, all the word lines WL and all the bit lines BL are preferably precharged. Additionally, voltage application for information recording may be performed by setting the potential of the word line WL relatively higher than that of the bit line BL.

2-2. Data Read Operation (Information Reproduction Operation)

A data read operation is performed by, for example, applying a voltage pulse to the selected storage layer (variable resistance element) 33 and detecting a current determined by the resistance of the memory cell MC. Here, the voltage pulse desirably has such a small amplitude as to prevent a change in the state of a material forming the variable resistance element 33. For example, a read voltage is applied to the selected memory cell MC through the bit line BL. Then, the sense amplifier 13 measures the corresponding current value.

2-3. Data Erase Operation

Reset Operation

A data erase operation is performed by using a large current pulse to subject the selected storage layer (variable resistance element) 33 to Joule heating to promote oxidation reduction reaction in the variable resistance element 33.

3. Manufacturing Method

An example of a method of manufacturing a semiconductor memory device according to the first embodiment will be described with reference to FIGS. 6A and 6B to FIGS. 15A and 15B. Here, the configuration of the semiconductor memory device shown in FIGS. 5A and 5B described above is taken by way of example. In the description, the figures with the reference character A are sectional views taken along line A-A' in FIG. 4. The figures with the reference character B are sectional views taken along line B-B' in FIG. 4. This also applies to the description below.

Before formation of the memory cell array 10, peripheral circuits such as the row decoder 11, the column decoder 12, and the sense amplifier 13 are formed in an element region on the semiconductor substrate.

Figures 6A, 6B:
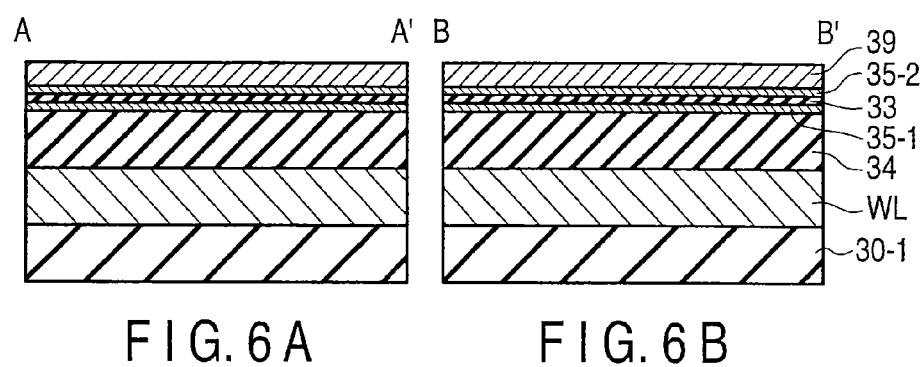
FIGS. 6A and 6B are sectional views showing a step of manufacturing the semiconductor memory device according to the first embodiment.

As shown in FIGS. 6A and 6B, for example, a silicon oxide film (SiO$_2$) or the like is formed on the formed peripheral circuits by a CVD (Chemical Vapor deposition) method, to form an interlayer insulating film 30-1. On the interlayer insulating film 30-1, for example, tungsten (W) or the like is formed by the CVD method to form a word line WL (a layer forming the word line WL; this also applies to the description below).

Similarly, for example, amorphous silicon, titanium nitride, metal oxide, titanium nitride, tungsten (W), and the like on the formed word line WL are sequentially stacked by the CVD method; in this case, an N-type layer, an intrinsic layer, and a P-type layer are stacked. Thus, a diode 34, a lower electrode 35-1, a storage layer 33, an upper electrode 35-2, and a conductive layer 39 are sequentially formed.

As shown in FIGS. 7A and 7B, photo resist is coated on the conductive layer 39. For example, an exposure operation and a transfer operation are performed on the coated photo resist by a lithography method. Thus, a mask material 41 with a line and space mask pattern is formed such that the surface of the conductive layer 39 is exposed in isolation regions in the BL direction (B-B' direction B).

As shown in FIGS. 8A and 8B, for example, anisotropic etching such as an RIE (Reactive Ion Etching) method is used to sequentially process the conductive layer 39, the upper electrode 35-2, the storage layer (variable resistance element) 33, the lower electrode 35-1, the diode 34, and the word line WL down to the top surface of the interlayer insulating film 30-1 through the formed mask material 41 as a mask. Thus, trenches are formed to separate the memory cells MC from one another in the BL direction B. Subsequently, the mask material 41 is removed (this description is hereinafter omitted). Alternatively, the mask material 41 is removed during the anisotropic etching.

As shown in FIGS. 9A and 9B, for example, the CVD method is used to bury a silicon oxide (SiO$_2$) film or the like in the formed trenches to form an interlayer insulating film 30-2.

Here, during the step of burying the silicon oxide film in the trenches, for example, after the silicon oxide film is buried in the trenches, the interlayer insulating film 30-2 can be etched through the conductive layer 39 as a stop layer using CMP (Chemical Mechanical Polishing) or the like. Thus, the interlayer insulating film 30-2 can be formed exclusively in the trenches.

As shown in FIGS. 10A and 10B, for example, the RIE method is used to etch back (recess) the interlayer insulating film 30-2 so as to align the top surface of the interlayer insulating film 30-2 with the bottom surface (39U) of the conductive layer 39. As a result, the bottom surface (39U) of the conductive layer 39 almost coincides with (is almost flush with) the bottom surface (BLU) serving subsequently as the bit line BL. The top surface and side surface of the conductive layer 39 are exposed. During this step, making the bottom surface (39U) of the conductive layer 39 almost coincide with (almost flush with) the bottom surface (BLU) serving as the bit line BL is based on, for example, etching time.

As shown in FIGS. 11A and 11B, for example, the CVD method is used to form tungsten (W) so as to form a bit line BL. Before this step, for example, nitriding tungsten (WN) may be formed on the top surface and side surface of the conductive layer 39 and on the interlayer insulating film 30-2 to form a barrier metal layer (38; shown in FIG. 5A). As a result, the bottom surface of the conductive layer 39 is almost equal to the interface (BLU) between the upper-layer wire BL and the interlayer insulating film 30-2.

As shown in FIGS. 12A and 12B, photo resist is coated on the bit line BL. For example, a mask material 42 with a line and space mask pattern is formed such that the surface of the bit line BL is exposed in isolation regions in the WL direction (A-A' direction A) by lithography method.

As shown in FIGS. 13A and 13B, for example, anisotropic etching such as the RIE method is used to sequentially process the bit line BL, the conductive layer 39, the upper electrode 35-2, the storage layer (variable resistance element) 33, the lower electrode 35-1, and the diode 34 down to the top surface of the word line WL through the formed mask material 42 as a mask. Thus, trenches are formed to separate the memory cells MC from one another in the WL direction A.

As shown in FIGS. 14A and 14B, for example, the CVD method is used to bury a silicon oxide (SiO$_2$) film or the like in the formed trenches to form an interlayer insulating film 30-3.

For example, the CVD method is used to form a silicon oxide (SiO$_2$) film or the like and thus an interlayer insulating film 30-4. The above-described manufacturing method allows the semiconductor memory device shown in FIGS. 5A and 5B described above to be manufactured.

4. Operation and Effects

The semiconductor memory device and the method of manufacturing the semiconductor memory device according to the first embodiment exert at least effects (1) to (4) described below.

(1) The first embodiment is advantageous for shrinking in the direction perpendicular to the substrate surface.

As described above, in the present example, the bottom surface (39U) of the conductive layer 39 almost coincides with (is almost flush with) the bottom surface (BLU) of the bit line. Thus, the conductive layer 39 can function as a part of the bit line BL.

In the above-described configuration, the film thickness of the conductive layer 39 can almost be prevented from contributing to the height in the direction perpendicular to the substrate surface of the semiconductor memory device. Hence, the configuration is most advantageous for a reduction in film thickness in the direction perpendicular to the substrate surface. Therefore, the configuration is most advantageous for shrinking in the direction perpendicular to the substrate surface.

(2) The first embodiment is advantageous for a reduction in aspect ratio.

As shown in FIGS. 10A and 10B, for example, the RIE method is used to etch back (recess) the interlayer insulating film 30-2 until the bottom surface (39U) of the conductive layer 39 almost coincides with (is almost flush with) the bottom surface (BLU) serving as the bit line BL. Subsequently, as shown in FIGS. 11A and 11B, a bit line BL is formed on the conductive layer 39 and on the etched-back interlayer insulating film 30-2.

Thus, when the bit line BL and the memory cell MC are sequentially processed down to the top surface of the word line WL to form trenches serving to separate the memory cells MC from one another in the WL direction A as shown in FIGS. 13A and 13B, the trenches can be formed with the film thickness of the conductive layer 39 reduced in the direction perpendicular to the substrate surface. This enables a reduction in the aspect ratio in the direction perpendicular to the substrate surface (vertical direction).

(3) The first embodiment is advantageous for improvement of reliability.

Moreover, as shown in FIGS. 9A and 9B, during the step of burying the interlayer insulating film 30-2 in the formed trenches, etching is performed with the conductive layer 39 used as a stopper layer. This allows the interlayer insulating film 30-2 to be formed only in the trenches. Here, the conductive film 39 is formed on the memory cell MC to serve as a protective film for the memory cell MC. This allows the interlayer insulating film 30-2 to be formed without impairing the characteristics of the memory cell MC. Therefore, the first embodiment is advantageous for improvement of reliability.

(4) The first embodiment is advantageous for simplification of the steps.

The conductive layer 39 can be used as a mask for an etching stopper and also as a part of the upper-layer wire. This enables a reduction in the number of required steps compared to the use of an etching stopper formed of an insulator.

Second Embodiment

An Example in which a Plurality of Layers of Cell Arrays are Provided and in Which the Bottom Surface of the Conductive Layer is Flush with the Bottom Surface of the Bit Line Now, a semiconductor memory device and a method of manufacturing a semiconductor memory device according to a second embodiment will be described. The present embodiment relates to an example in which a plurality of layers of cell arrays are provided and in which the bottom surface 39U of the conductive layer 39 is flush with the bottom surface BLU of the bit line BL. The same aspects as those of the above-described first embodiment will not be described in detail.

<Planar and Sectional Configurations>

First, examples of planar and sectional configurations of the semiconductor memory device according to the present example will be described with reference to FIGS. 16, 17A, and 17B.

Figure 16:
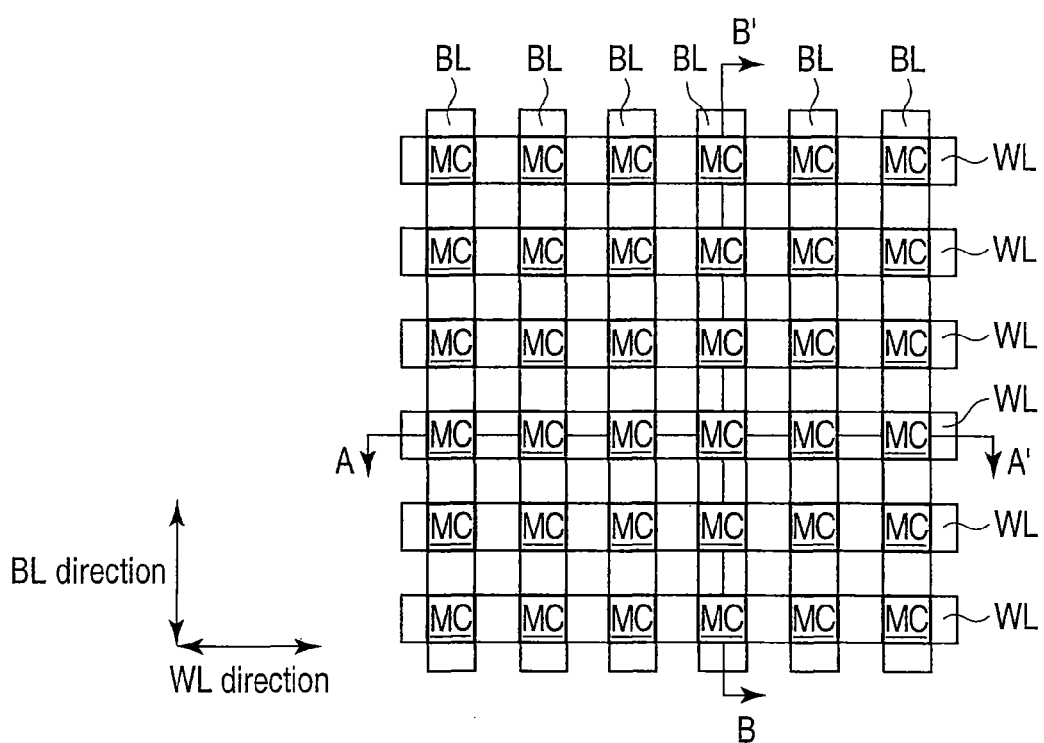
FIG. 16 is plan view showing an example of the planar configuration of the semiconductor memory device according to a second embodiment.
Figures 17A, 17B:
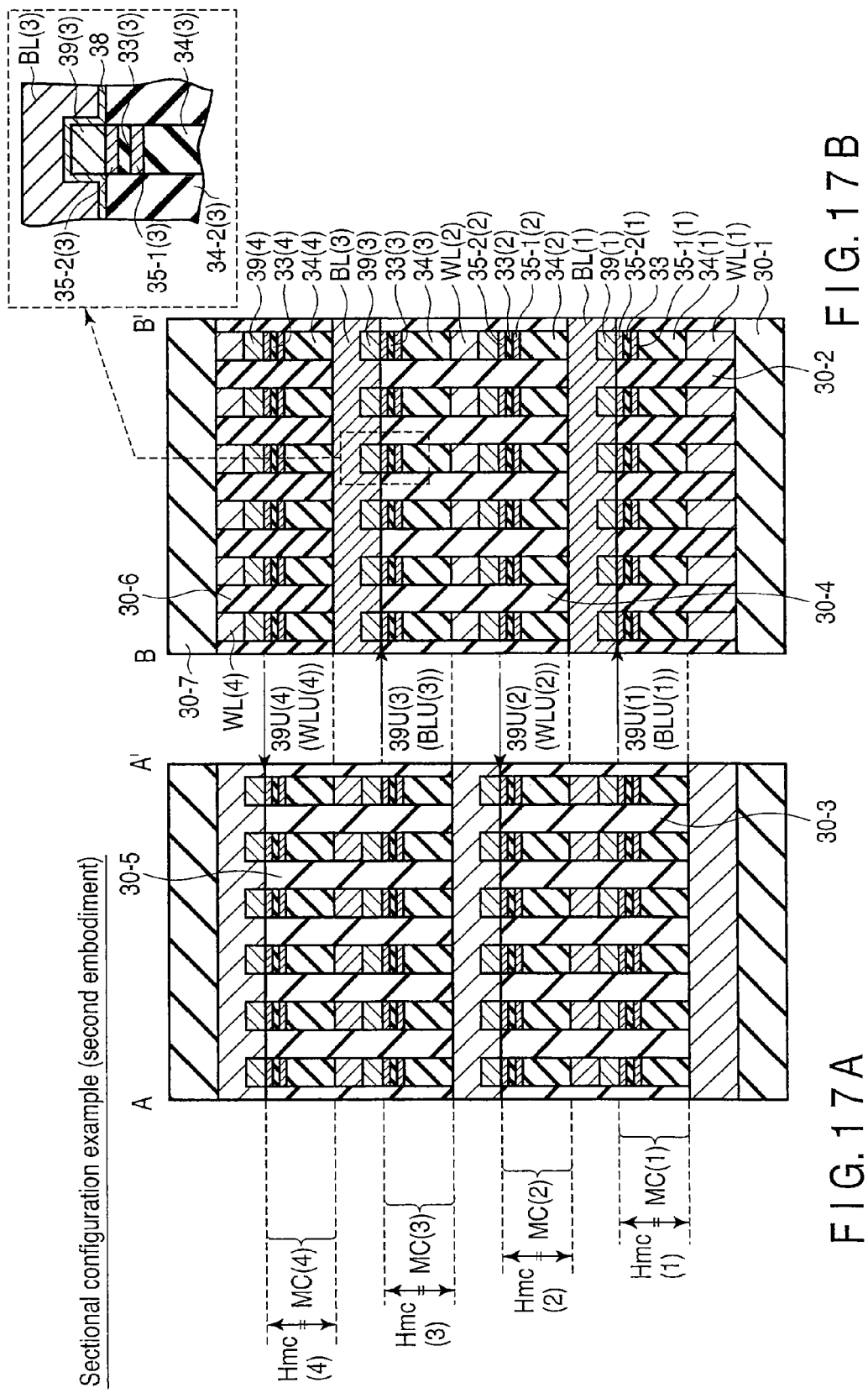
FIG. 17A is a sectional view taken along line A-A' in FIG. 16.
FIG. 17B is a sectional view taken along line B-B' in FIG. 16.

As shown in FIGS. 16, 17A, and 17B, the present example is different from the single-layer memory cell structure according to the above-described first embodiment in that the present example involves at least two, plural layers of cell arrays. Here, the case in which four layers of memory cells MC(1) to MC(4) are provided will be described by way of example. However, the number of layers is not limited to four; for example, 2, 8, or 16 layers may be provided.

In the present example, the bottom surfaces 39U(1) to 39U(4) of the conductive layers 39(1) to 39(4) are flush with the interfaces (BLU(1), WLU(2), BLU(3), and WLU(4)) between the upper-layer wires (BL(1), WL(2), BL(3), and WL(4)) and the interlayer insulating films 30-2, 30-3, 30-4, 30-5, and 30-6, as is the case with the first embodiment.

Furthermore, the heights (film thicknesses) Hmc(1) to Hmc(4) of the memory cells MC in the respective layers (1) to (4) are similar.

<Manufacturing Method>

Now, an example of a method of manufacturing a semiconductor memory device according to the second embodiment will be described with reference to FIGS. 18A, 18B to 42A and 42B. Here, the configuration of the semiconductor memory device shown in FIGS. 17A and 17B will be described by way of example. The same aspects as those of the above-described first embodiment will not be described below.

(First Layer)

As shown in FIGS. 18A and 18B, for example, similar manufacturing steps are used to sequentially form an interlayer insulating film 30-1, a word line WL(1), a diode 34(1), a lower electrode 35-1(1), a storage layer 33(1), an upper electrode 35-2(1), and a conductive layer 39(1) on formed peripheral circuits.

As shown in FIGS. 19A and 19B, photo resist is coated on the conductive layer 39. For example, a mask material 44(1) with a line and space mask pattern is formed by the lithography method, and the surface of the conductive layer 39(1) which is due to form trenches is exposed in the BL direction (B-B' direction).

As shown in FIGS. 20A and 20B, for example, anisotropic etching such as the RIE method is used to sequentially process the conductive layer 39(1), the upper electrode 35-2(1), the storage layer 33(1), the lower electrode 35-1(1), the diode

34(1), and the word line WL(1) down to the top surface of the interlayer insulating film 30-1 through the formed mask material 44(1) as a mask. Thus, trenches are formed to separate the memory cells MC(1) from one another in the BL direction B. The mask material 44(1) is removed.

As shown in FIGS. 21A and 21B, for example, an interlayer insulating film 30-2 is formed in the formed trenches as is the case with the first embodiment. Here, after the silicon oxide film is buried in the trenches, for example, CMP (Chemical Mechanical Polishing) can be used to form the interlayer insulating film 30-2 exclusively in the trenches using the conductive layer 39(1) as a stopper layer.

As shown in FIGS. 22A and 22B, for example, the RIE method is used to etch back (recess) the interlayer insulating film 30-2 so as to align the top surface of the interlayer insulating film 30-2 with the bottom surface (39U(1)) of the conductive layer 39. As a result, the bottom surface (39U) of the conductive layer 39 almost coincides with (is almost flush with) the bottom surface (BLU(1)) serving subsequently as the bit line BL. The top surface and side surface of the conductive layer 39(1) are exposed. During this step, making the bottom surface (39U(1)) of the conductive layer 39(1) almost coincide with (almost flush with) the bottom surface (BLU(1)) serving as the bit line BL is based on, for example, etching time.

As shown in FIGS. 23A and 23B, a bit line BL(1), a diode 34(2), a lower electrode 35-1(2), a storage layer 33(2), and a conductive layer 39(2) are sequentially formed on the conductive layer 39(2) and on the interlayer insulating film 30-2.

As shown in FIGS. 24A and 24B, photo resist is coated on the conductive layer 39(2). For example, a mask material 44(2) with a line and space mask pattern is formed by lithography, and the surface of the conductive layer 39(2) which is due to form trenches is exposed in the WL direction (A-A' direction).

As shown in FIGS. 25A and 25B, the conductive layers 39(1) and 39(2), upper electrodes 35-2(1) and 35-2(2), storage layers 33(1) and 33(2), lower electrodes 35-1(1) and 35-1(2), and diodes 34(1) and 34(2) in the first and second layers, respectively, are processed down to the top surface of the word line WL(1) through the formed mask material 44(2) as a mask. Thus, trenches are formed to separate the memory cells MC(1) from one another in the WL direction A. The mask material 44(2) is removed.

As shown in FIGS. 26A and 26B, for example, the CVD method is used to bury a silicon oxide ($SiO_2$) film or the like in the formed trenches to form an interlayer insulating film 30-3 in the trenches. Thus, the first layer of memory cell MC(1) is formed. Here, after the silicon oxide film is buried in the trenches, for example, CMP (Chemical Mechanical Polishing) can be used to form the interlayer insulating film 30-3 exclusively in the trenches using the conductive layer 39(2) as a stopper layer.

(Second Layer)

As shown in FIGS. 27A and 27B, for example, the RIE method is used to etch back (recess) the interlayer insulating film 30-3 so as to align the top surface of the interlayer insulating film 30-3 with the bottom surface (39U(2)) of the conductive layer 39. As a result, the bottom surface (39U(2)) of the conductive layer 39 almost coincides with (is almost flush with) the bottom surface (WLU(2)) serving subsequently as the word line WL. The top surface and side surface of the conductive layer 39(2) are exposed. During this step, making the bottom surface (39U(2)) of the conductive layer 39(2) almost coincide with (almost flush with) the bottom surface (WLU(2)) serving as the word line WL is based on, for example, etching time.

Figures 28A, 28B:
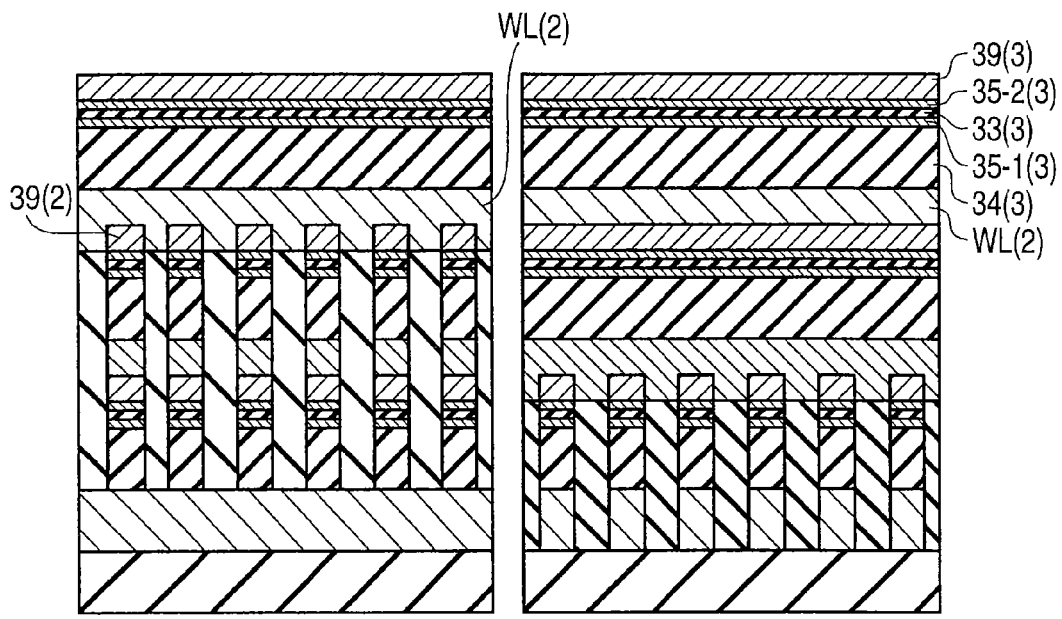
FIGS. 28A and 28B are sectional views showing a step of manufacturing the semiconductor memory device according to the second embodiment.

As shown in FIGS. 28A and 28B, a word line WL(2), a diode 34(3), a lower electrode 35-1(3), a storage layer 33(3), an upper electrode 35-2(3), and a conductive layer 39(3) are sequentially formed on the conductive layer 39(2) and on the interlayer insulating film 30-3.

Figures 29A, 29B:
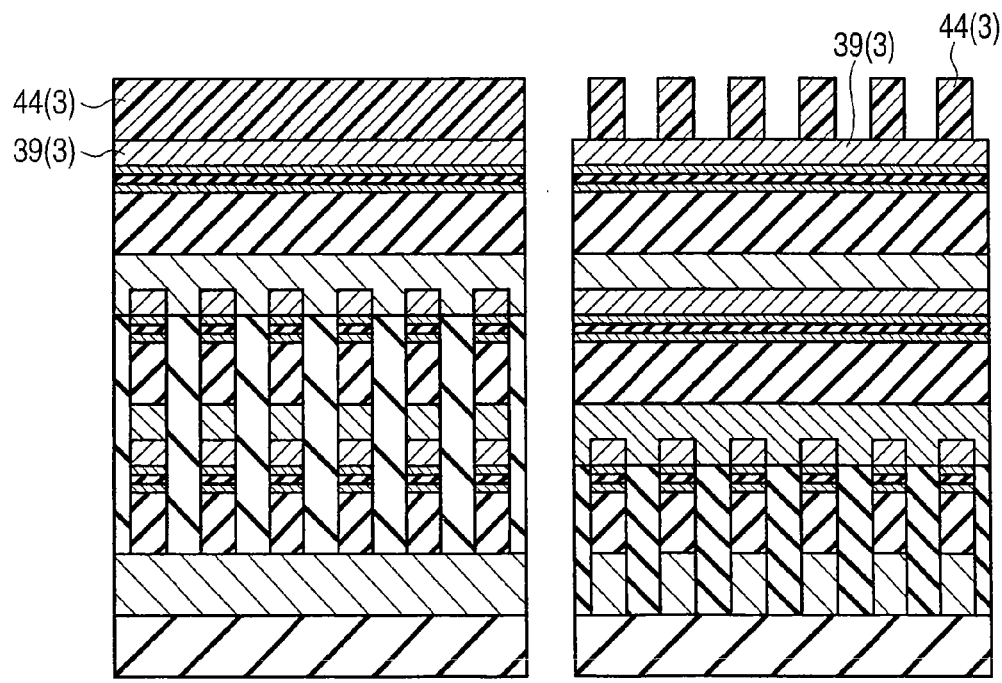
FIGS. 29A and 29B are sectional views showing a step of manufacturing the semiconductor memory device according to the second embodiment.

As shown in FIGS. 29A and 29B, photo resist is coated on the conductive layer 39(3). For example, a mask material 44(3) with a line and space mask pattern is formed by lithography method, and the surface of the conductive layer 39(3) which is due to form trenches is exposed in the BL direction (B-B' direction B).

As shown in FIGS. 30A and 30B, the conductive layers 39(2) and 39(3), upper electrodes 35-2(2) and 35-2(3), storage layers 33(2) and 33(3), lower electrodes 35-1(2) and 35-1(3), and diodes 34(2) and 34(3) in the second and third layers, respectively, are processed down to the top surface of the bit line BL(1) through the formed mask material 44(3) as a mask. Thus, trenches are formed to separate the memory cells MC(2) from one another in the BL direction B.

As shown in FIGS. 31A and 31B, for example, a silicon oxide ($SiO_2$) film or the like is buried in the formed trenches to form an interlayer insulating film 30-4 in the trenches. Thus, the second layer of memory cell MC(2) is formed. Here, after the silicon oxide film is buried in the trenches, for example, CMP (Chemical Mechanical Polishing) can be used to form the interlayer insulating film 30-4 exclusively in the trenches using the conductive layer 39(3) as a stopper layer.

(Third Layer)

As shown in FIGS. 32A and 32B, for example, the RIE method is used to etch back (recess) the interlayer insulating film 30-4 so as to align the top surface of the interlayer insulating film 30-2 with the bottom surface (39U(3)) of the conductive layer 39. As a result, the bottom surface (39U(3)) of the conductive layer 39 almost coincides with (is almost flush with) the bottom surface (BLU(3)) serving subsequently as the bit line BL. The top surface and side surface of the conductive layer 39 are exposed. During this step, making the bottom surface (39U(3)) of the conductive layer 39(3) almost coincide with (almost flush with) the bottom surface (BLU(3)) serving as the bit line BL is based on, for example, etching time.

Figure 33A:
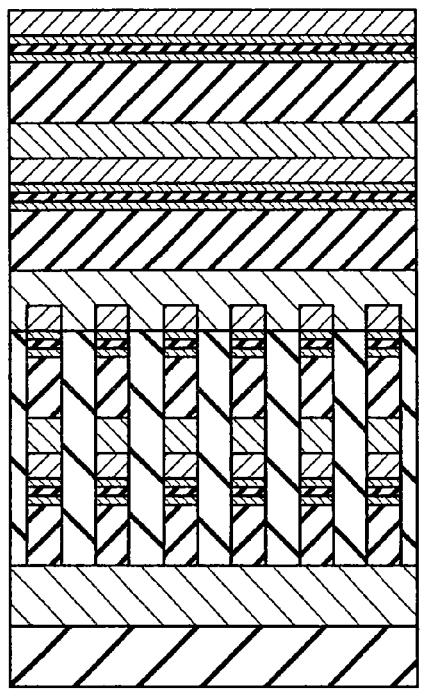
FIGS. 33A and 33B are sectional views showing a step of manufacturing the semiconductor memory device according to the second embodiment.
Figure 33B:
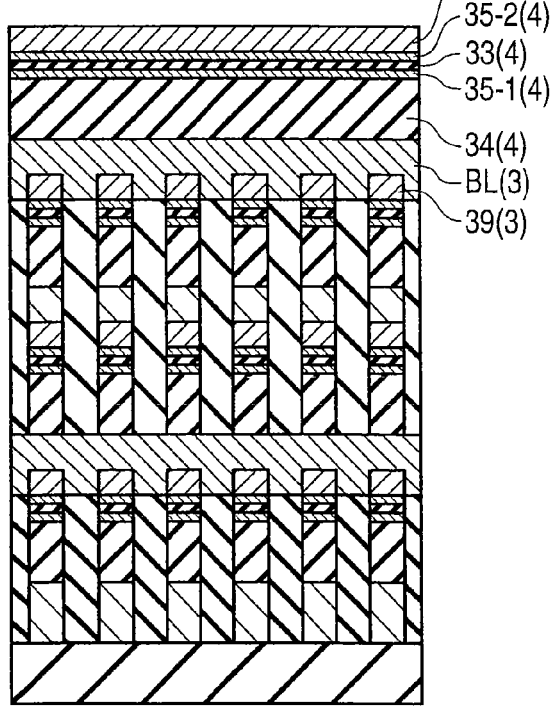

As shown in FIGS. 33A and 33B, a bit line BL(3), a diode 34(4), a lower electrode 35-1(4), a storage layer 33(4), an upper electrode 35-2(4), and a conductive layer 39(4) are sequentially formed on the conductive layer 39(3) and on the interlayer insulating film 30-4.

As shown in FIGS. 34A and 34B, photo resist is coated on the conductive layer 39(4). For example, a mask material 44(4) with a line and space mask pattern is formed by lithography method, and the surface of the conductive layer 39(4) which is due to form trenches is exposed in isolation regions in the WL direction (A-A' direction A).

As shown in FIGS. 35A and 35B, the conductive layers 39(3) and 39(4), upper electrodes 35-2(3) and 35-2(4), storage layers 33(3) and 33(4), lower electrodes 35-1(3) and 35-1(4), and diodes 34(3) and 34(4) in the third and fourth layers, respectively, are processed down to the top surface of the word line WL(2) through the formed a mask material 44(4) as a mask. Thus, trenches are formed to separate the memory cells MC(3) and MC(4) from one another in the WL direction A. The mask material 44(4) is removed.

Figure 36A:
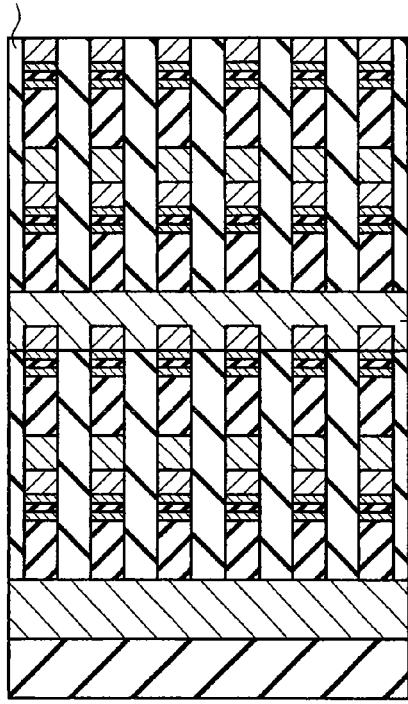
FIGS. 36A and 36B are sectional views showing a step of manufacturing the semiconductor memory device according to the second embodiment.
Figure 36B:
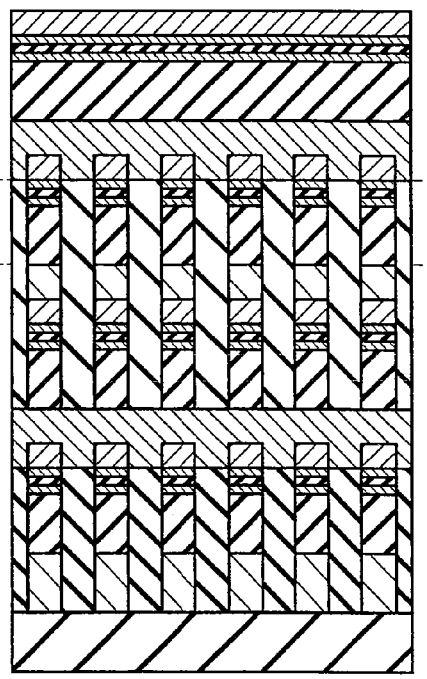

As shown in FIGS. 36A and 36B, for example, a silicon oxide ($SiO_2$) film or the like is buried in the formed trenches to form an interlayer insulating film 30-5 in the trenches. Thus, the third layer of memory cell MC(3) is formed. Here, after the silicon oxide film is buried in the trenches, for example, CMP (Chemical Mechanical Polishing) can be used to form the interlayer insulating film 30-5 exclusively in the trenches using the conductive layer 39(4) as a stopper layer.

(Fourth Layer)

Figure 37A:
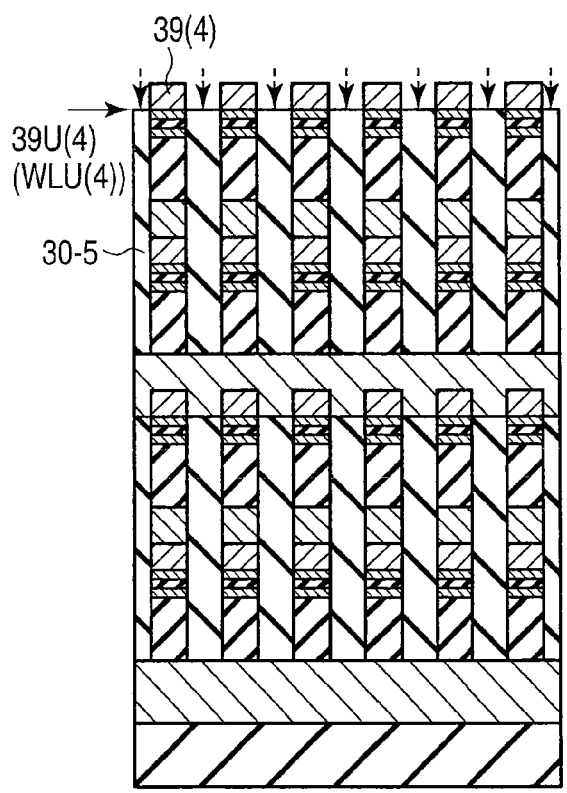
FIGS. 37A and 37B are sectional views showing a step of manufacturing the semiconductor memory device according to the second embodiment.
Figure 37B:
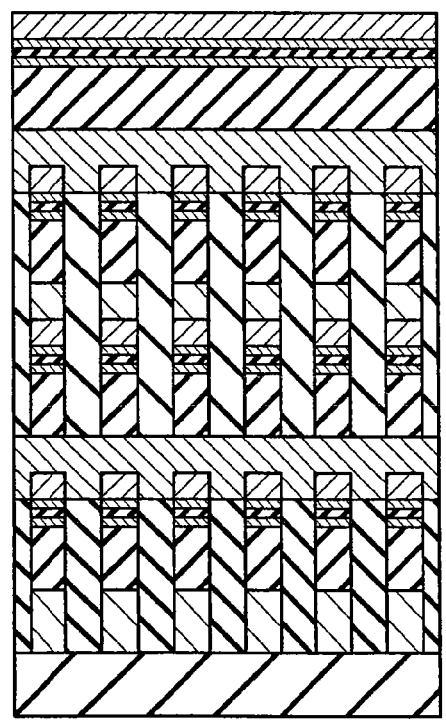

As shown in FIGS. 37A and 37B, for example, the RIE method is used to etch back (recess) the interlayer insulating film 30-5 so as to align the top surface of the interlayer insulating film 30-5 with the bottom surface (39U(4)) of the conductive layer 39(4). As a result, the bottom surface (39U(4)) of the conductive layer 39 almost coincides with (is almost flush with) the bottom surface (WLU(4)) serving subsequently as the word line WL. The top surface and side surface of the conductive layer 39(4) are exposed. During this step, making the bottom surface (39U(4)) of the conductive layer 39(4) almost coincide with (almost flush with) the bottom surface (WLU(4)) serving as the word line WL is based on, for example, etching time.

As shown in FIGS. 38A and 38B, a word line WL(4) is are sequentially formed on the conductive layer 39(4) and on the interlayer insulating film 30-5.

Figures 39A, 39B:
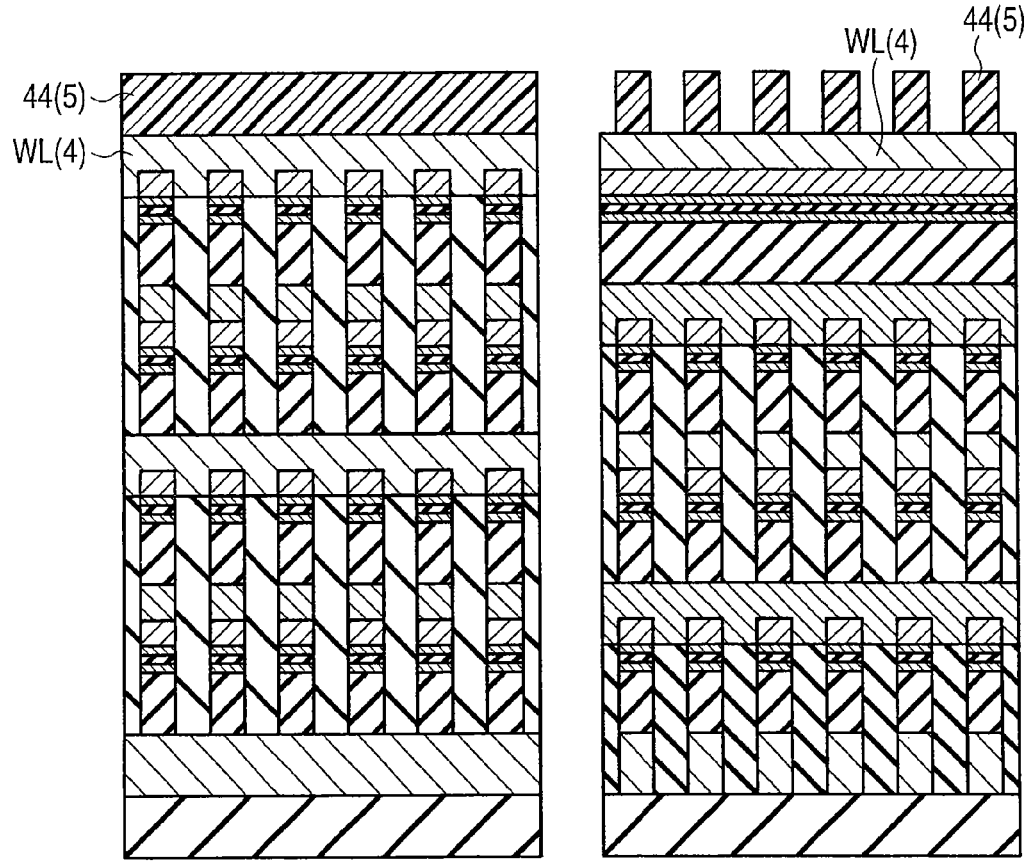
FIGS. 39A and 39B are sectional views showing a step of manufacturing the semiconductor memory device according to the second embodiment.

As shown in FIGS. 39A and 39B, photo resist is coated on the word line WL(4). For example a mask material 44(5) with a line and space mask pattern is formed by lithography method, and the surface of the word line WL(4) which is due to form trenches is exposed in isolation regions in the BL direction (B-B' direction B).

As shown in FIGS. 40A and 40B, the conductive layer 39(4), upper electrode 35-2(4), storage layer 33(4), lower electrode 35-1(4), and diode 34(4) in the fourth layer is processed down to the top surface of the bit line BL(3) through the formed a mask material 44(4) as a mask. Thus, trenches are formed to separate the memory cells MC(4) from one another in the BL direction B. The mask material 44(4) is removed.

Figures 41A, 41B:
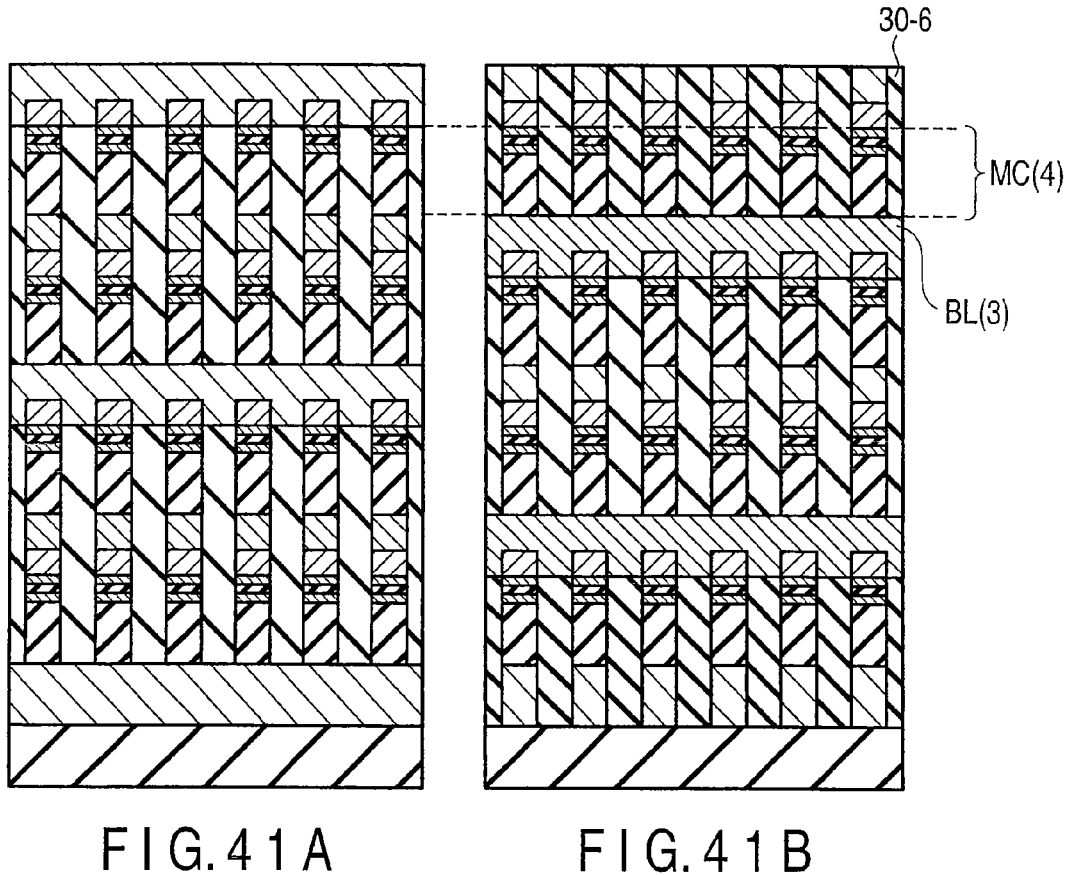
FIGS. 41A and 41B are sectional views showing a step of manufacturing the semiconductor memory device according to the second embodiment.

As shown in FIGS. 41A and 41B, for example, a silicon oxide (SiO$_2$) film or the like is buried in the formed trenches to form an interlayer insulating film 30-6 in the trenches. Thus, the fourth layer of memory cell MC(4) is formed. Here, after the silicon oxide film is buried in the trenches, for example, CMP (Chemical Mechanical Polishing) can be used to form the interlayer insulating film 30-6 exclusively in the trenches using the conductive layer 39(5) as a stopper layer.

Figure 42A:
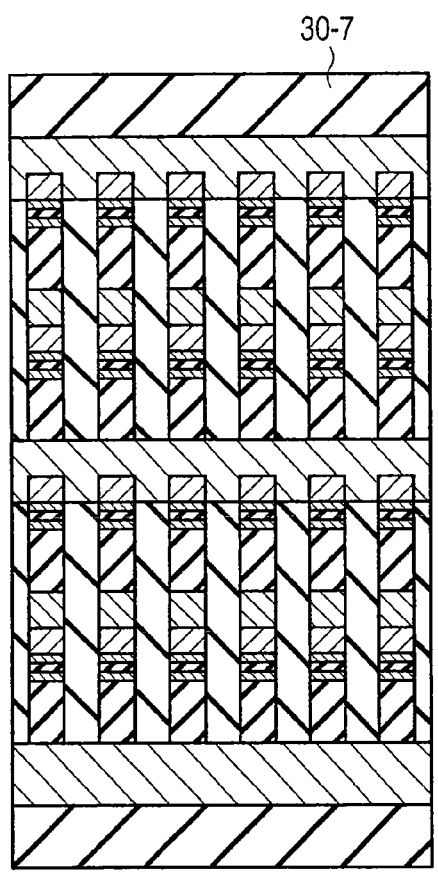
FIGS. 42A and 42B are sectional views showing a step of manufacturing the semiconductor memory device according to the second embodiment.
Figure 42B:
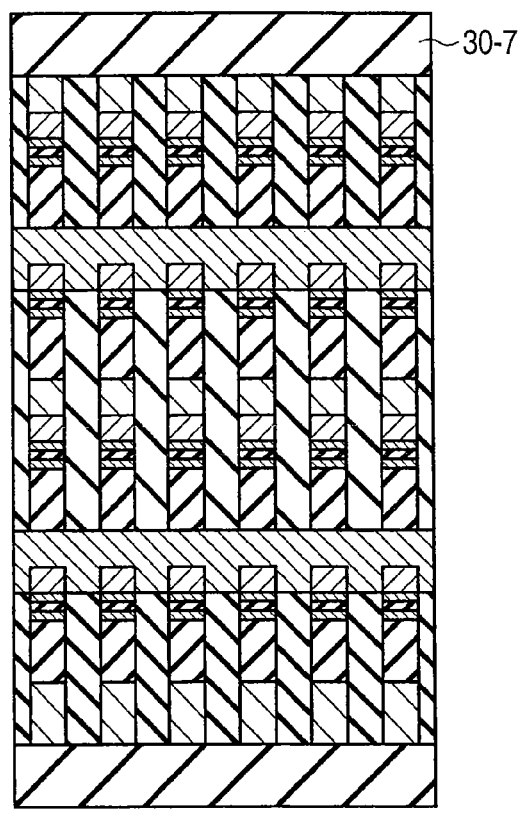

As shown in FIGS. 42A and 42B, an interlayer insulating film 30-7 is formed on the formed structure to manufacture the semiconductor memory device shown in FIGS. 17A and 17B.

<Operation and Effects>

The semiconductor memory device and the method of manufacturing the semiconductor memory device according to the second embodiment exert at least effects similar to those described above in (1) to (4). Moreover, in the present example, since a plurality of layers (four layers) of cell arrays are stacked, the effects (1) and (2) are more significant.

The effect (1) almost prevents the film thickness of all the conductive layers 39(1) to 39(5) from contributing to the height in the direction perpendicular to the substrate surface of the semiconductor memory device. That is, this effect can be made more significant by increasing the number of layers of cell arrays.

Owing to the effect (2), compared to Embodiment 1 that processes and separates one layer of memory cell MC(1), Embodiment 2 processes and separates two layers of memory cells MC(1) and MC(2) from each other in the WL direction A. That is, the height of the memory cell MC(1) plus the height of the memory cell MC(2) is processing in Embodiment 2. Thus, Embodiment 2 involves a higher aspect ratio than Embodiment 1.

Consequently, with the film thickness of the conductive layer 39 in the direction perpendicular to the substrate surface reduced, the two layers of memory cells MC(1) and MC(2) can be processed and separated from each other in the WL direction A. Therefore, Embodiment 2 is more effective in reducing the aspect ratio.

Moreover, a plurality of layers of cell arrays enables an increase in the storage capacity of the memory cells MC(1) to MC(4). This is advantageous for an increase in capacity and a reduction in bit cost.

In addition, the method of manufacturing the semiconductor memory device according to the present example relates to a cross point structure in which a plurality of layers of memory cells and wires are processed at a time and which requires no alignment margin (For example, FIG. 25A, FIG. 30B, and FIG. 35A). Thus, a plurality of layers of memory cells and wires can be formed at a time, enabling a reduction in the number of manufacturing steps. Therefore, Embodiment 2 is advantageous in terms of a reduction in manufacturing costs.

Third Embodiment

An Example in which a Single Layer of Cell Array is Provided and in which the Conductive Layer has a Taper Angle Now, a semiconductor memory device and a method of manufacturing the semiconductor memory device according to a third embodiment will be described. The third embodiment relates to an example in which a single layer of cell array is provided and in which the conductive layer 39 has a taper angle. The same aspects as those of the above-described first embodiment will not be described below in detail.

<Examples of a Planar Configuration and a Sectional Configuration>

First, examples of planar and sectional configurations of the semiconductor memory device according to the present example will be described with reference to FIG. 43 and FIGS. 44A, and 44B.

Figure 43:
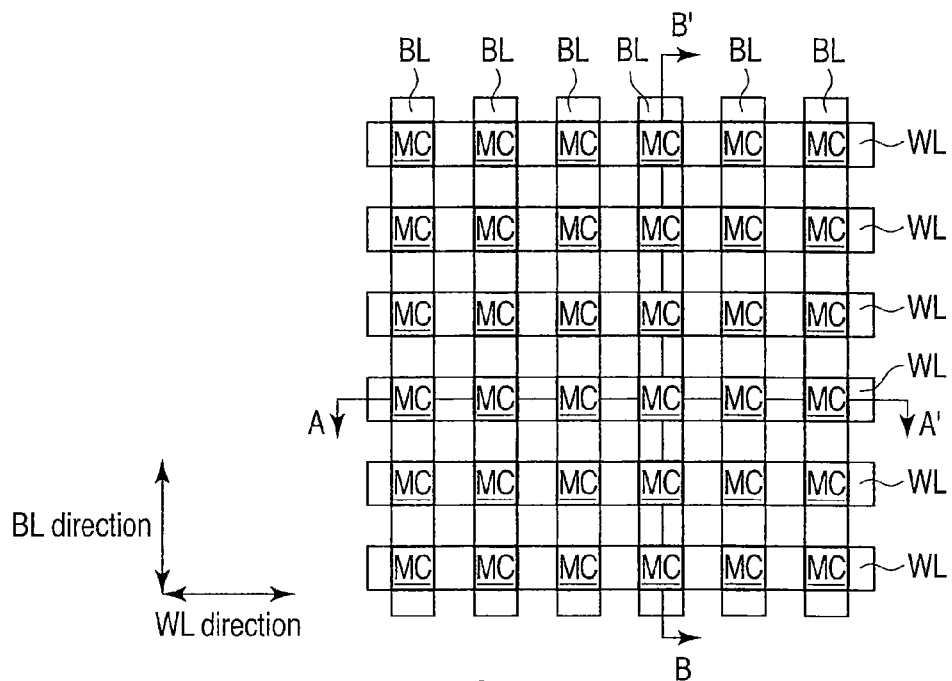
FIG. 43 is plan view showing an example of the planar configuration of the semiconductor memory device according to a third embodiment.
Figures 44A, 44B:
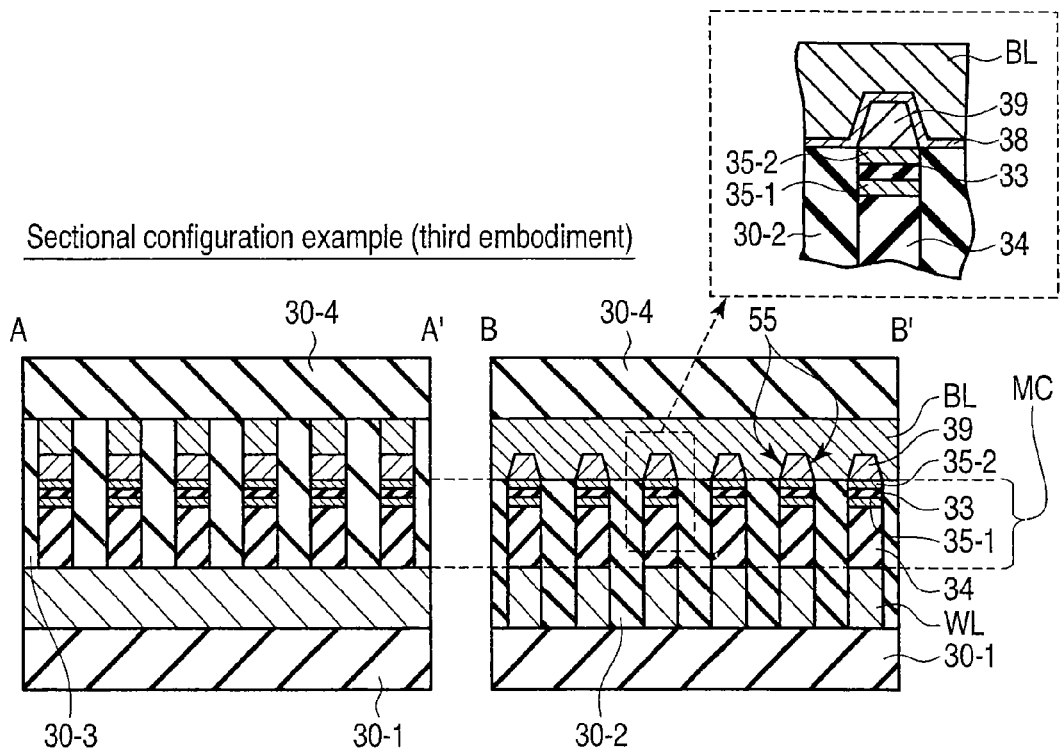
FIG. 44A is a sectional view taken along line A-A' in FIG. 43.
FIG. 44B is a sectional view taken along line B-B' in FIG. 43.

As shown in FIG. 43 and FIGS. 44A, and 44B, the present example is different from the above-described first embodiment in that the conductive layer 39 has a taper angle 55 at the tip portion of the layer.

<Manufacturing Method>

Now, an example of the method of manufacturing the semiconductor memory device according to the third embodiment will be described with reference to FIGS. 45A and 45B to FIGS. 48A and 48B. Here, the configuration of the semiconductor memory device shown in FIG. 44B described above will be described by way of example. The same aspects as those of the above-described first embodiment will not be described below.

As shown in FIGS. 45A and 45B, similar manufacturing steps are used to sequentially form an interlayer insulating film 30-1, a word line WL, a diode 34, a lower electrode 35-1, a storage layer 33, an upper electrode 35-2, and a conductive layer 39 on the above-described formed peripheral circuits.

As shown in FIGS. 46A and 46B, for example, the RIE method is used to etch back (recess) the interlayer insulating film 30-2 so as to align the top surface of the interlayer insulating film 30-2 with the bottom surface (39U) of the conductive layer 39. As a result, the bottom surface (39U) of the conductive layer 39 almost coincides with (is almost flush with) the bottom surface (BLU) serving subsequently as the bit line BL. The top surface and side surface of the conductive layer 39 are exposed. During this step, making the bottom surface (39U) of the conductive layer 39 almost coincide with (almost flush with) the bottom surface (BLU) serving as the bit line BL is based on, for example, etching time.

As shown in FIGS. 47A and 47B, for example, isotropic etching is used to etch the tip portion of the conductive layer 39 so as to form a taper angle 55 at the tip portion. Furthermore, even anisotropic etching allows the taper angle 55 to be formed at the tip portion of the conductive layer 39 by adjusting etching conditions. The etching in the step of forming the taper angle 55 may be dry etching under conditions different from those in the etch-back step shown in FIGS. 46A and 46B described above. Alternatively, the amount of time for the etch-back step shown in FIGS. 46A and 46B described above may be increased such that the etch-back step lasts longer. Alternatively, the etching ratio between the interlayer insulating film 30-2 and the conductive layer 39 can be adjusted so as to form the taper angle 55 simultaneously with the etch-back step shown in FIGS. 46A and 46B. That is, the etching rate for the conductive layer 39 is slightly increased. As a result, the upper portion of the conductive layer 39 exposed from the interlayer insulating film 30-2 is simultaneously etched to chamfer the conductive layer 39. Thus, the taper angle 55 is formed. Consequently, the taper angle 55 can be formed without increasing the number of steps.

Figure 48A:
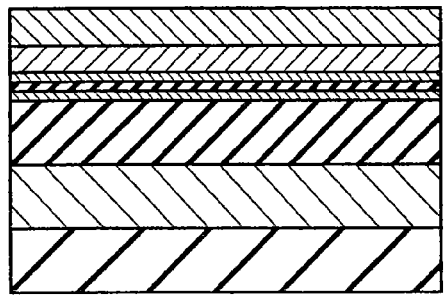
FIGS. 48A and 48B are sectional views showing a step of manufacturing the semiconductor memory device according to the third embodiment.
Figure 48B:
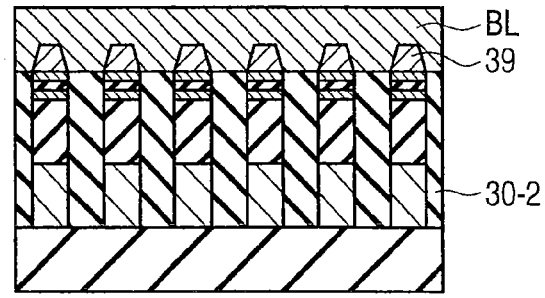

As shown in FIGS. 48A and 48B, a manufacturing method similar to that described above is used to form a bit line BL on the conductive layer 39 and on the interlayer insulating film 30-2.

Subsequently, manufacturing steps similar to those described above are carried out to manufacture the semiconductor memory device shown in FIGS. 44A and 44B described above.

<Operation and Effects>

The semiconductor memory device and the method of manufacturing the semiconductor memory device according to the third embodiment exert at least effects similar to those described above in (1) to (4). Moreover, the present example is different from the first embodiment in that the conductive layer 39 further has the taper angle 55 at the tip portion of the layer.

Thus, as shown in FIGS. 48A and 48B, in case a bit line BL is formed on the conductive layer 39, the larger space between the conductive layers 39 resulting from the taper angle 55 allows the bit line BL to be easily buried and formed. Thus, reliability related to the appropriateness of the burial can be improved.

Therefore, the third embodiment is further advantageous.

Fourth Embodiment

An Example in which a Plurality of Layers of Cell Array are Provided and in which the Conductive Layer has a Taper Angle Now, a semiconductor memory device and a method of manufacturing the semiconductor memory device according to a fourth embodiment will be described with reference to FIG. 49 to FIG. 59. The fourth embodiment relates to an example in which a plurality of layers of cell arrays are provided and in which the conductive layers 39(1) to 39(4) have taper angles 55(1) to 55(4), respectively. The same aspects as those of the above-described second embodiment will not be described below in detail.

<Examples of a Planar Configuration and a Sectional Configuration>

First, examples of planar and sectional configurations of the semiconductor memory device according to the fourth embodiment will be described with reference to FIG. 49 to FIG. 59. The present embodiment relates to an example in which a plurality of layers of cell arrays are provided and in which the conductive layers 39(1) to 39(4) have taper angles 55(1) to 55(4), respectively. The same aspects as those of the above-described second embodiment will not be described below in detail.

<Examples of a Planar Configuration and a Sectional Configuration>

First, examples of planar and sectional configurations of the semiconductor memory device according to the present example will be described with reference to FIG. 49 and FIGS. 50A and 50B.

Figure 49:
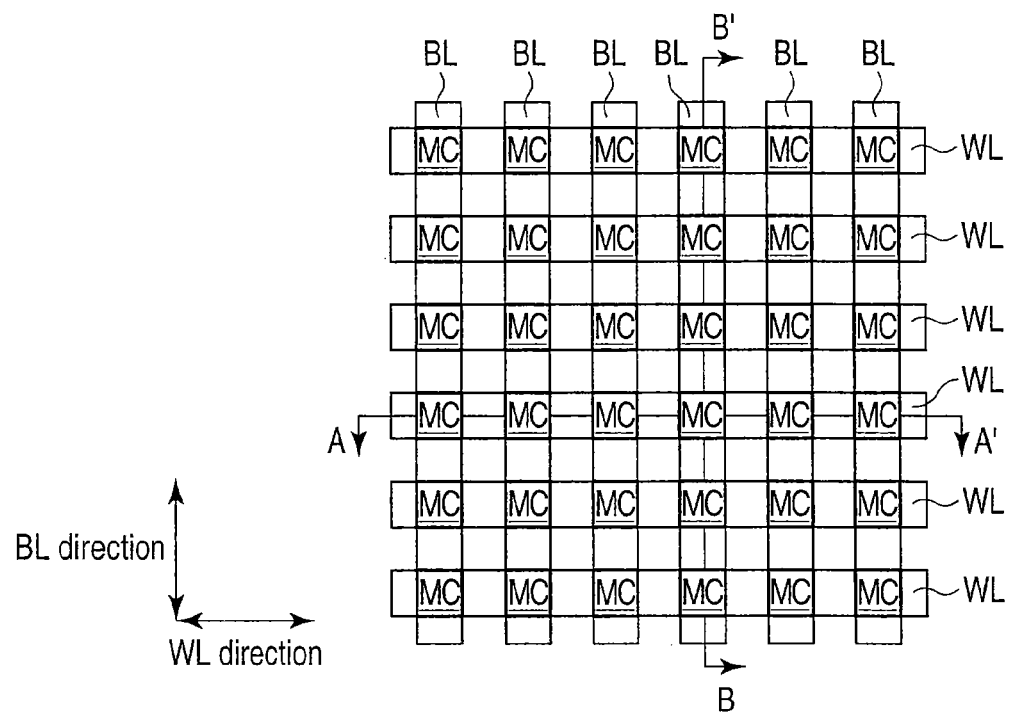
FIG. 49 is plan view showing an example of the planar configuration of the semiconductor memory device according to a fourth embodiment.
Figures 50A, 50B:
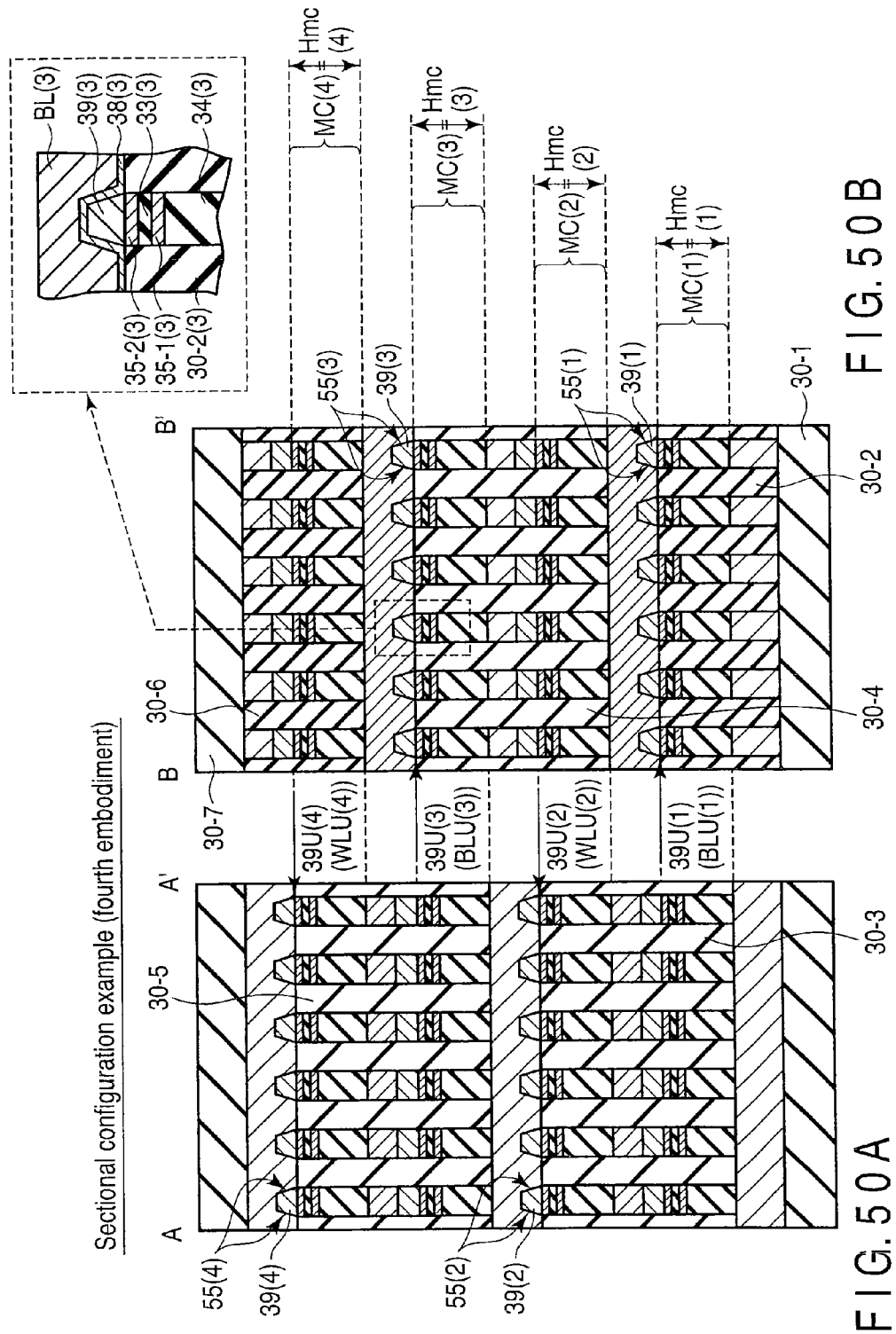
FIG. 50A is a sectional view taken along line A-A' in FIG. 49.
FIG. 50B is a sectional view taken along line B-B' in FIG. 49.

As shown in FIG. 49 and FIGS. 50A and 50B, in the present example, at least two, plural layers (four layers) of cell arrays are provided.

In addition, the present example is different from the above-described second embodiment in that both the tip portions of the conductive layers 39(2) and 39(4) have taper angles 55(2) and 55(4), respectively, in the word line direction A and in that both the tip portions of the conductive layers 39(1) and 39(3) further have taper angles 55(1) and 55(3), respectively, in the bit line direction B.

The heights Hmc(1) to Hmc(4) of the memory cells MC in the respective layers (1) to (4) are similar. Furthermore, in the word line direction A, the tip portions of the conductive layers 39(1) and 39(3) do not have the taper angle 55, and the upper shape of each of the tip portions has almost the same width as that of the corresponding one of the bit lines BL(1) and BL(3) formed on the conductive layers 39(1) and 39(3), respectively. Additionally, in the bit line direction B, the tip portion of the conductive layer 39(2) does not have the taper angle 55, and the upper shape of the tip portion has almost the same width as that of the word lines WL(2) and WL(4) formed on the conductive layer 39(2). That is, the taper angle 55 is formed only on the sectional tip portion of each of the conductive layers 39(1) to 39(4) which is, in a sectional view, connected to the corresponding one of the bit lines BL(1) and BL(3) or the word lines WL(2) and WL(4). In other words, the taper angle 55 is not formed on the sectional tip portion of each of the conductive layers 39(1) to 39(4) which is, in a sectional view, separate from the bit lines BL(1) and BL(3) or the word lines WL(2) and WL(4).

<Manufacturing Method>

Now, an example of the method of manufacturing the semiconductor memory device according to the fourth embodiment will be described with reference to FIGS. 51A and 51B to FIGS. 59A and 59B. Here, the configuration of the semiconductor memory device shown in FIGS. 50A and 50B described above will be described by way of example. The same aspects as those of the above-described second embodiment will not be described below.

As shown in FIGS. 51A and 51B, similar manufacturing steps are used to form a conductive layer 39(1), an upper electrode 35-2(1), a storage layer 33(1), a lower electrode 35-1(1), a diode 34(1), a word line WL(1), and an interlayer insulating film 30-2 on the interlayer insulating film 30-1.

As shown in FIGS. 52A and 52B, for example, the RIE method is used to etch back (recess) the interlayer insulating film 30-2 so as to align the top surface of the interlayer insulating film 30-2 with the bottom surface (39U(1)) of the conductive layer 39(1). As a result, the bottom surface (39U(1)) of the conductive layer 39 almost coincides with (is almost flush with) the bottom surface (BLU(1)) serving subsequently as the bit line BL. The top surface and side surface of the conductive layer 39(1) are exposed.

As shown in FIGS. 53A and 53B, for example, a dry etching method such as RIE is used to recess the tip portion of the conductive layer 39(1) so as to form a taper angle 55(1) at the tip portion of the conductive layer 39(1) in the bit line direction B. In this step, the dry etching method such as RIE may be carried out under different conditions. Alternatively, the amount of time for the etch-back step shown in FIGS. 52A and 52B described above may be increased such that the etch-back step lasts longer.

Figures 54A, 54B:
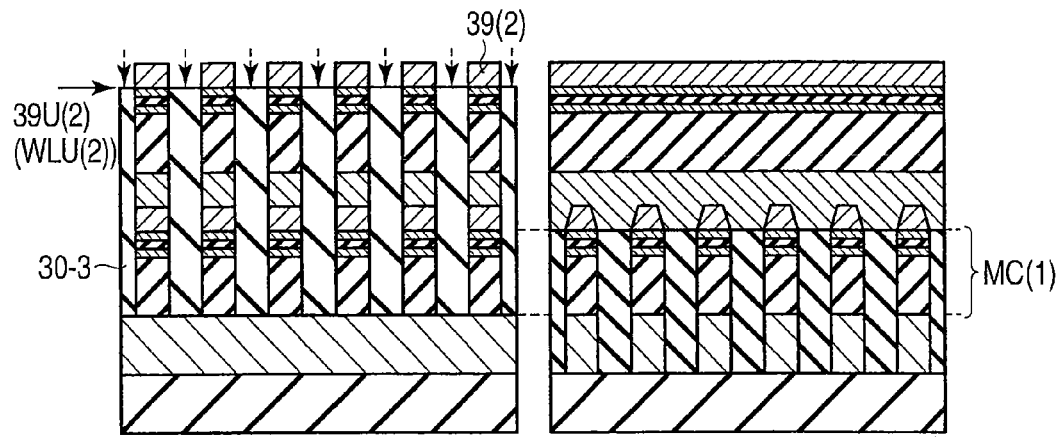
FIGS. 54A and 54B are sectional views showing a step of manufacturing the semiconductor memory device according to the fourth embodiment.

As shown in FIGS. 54A and 54B, manufacturing steps similar to those described above are used to form the first layer of memory cell MC(1). Subsequently, for example, the RIE method is used to etch back (recess) the interlayer insulating film 30-3 until the bottom surface (39U(2)) of the conductive layer 39(2) almost coincides with (is almost flush) with the bottom surface (WLU(2)) serving as the word line WL(2).

Figures 55A, 55B:
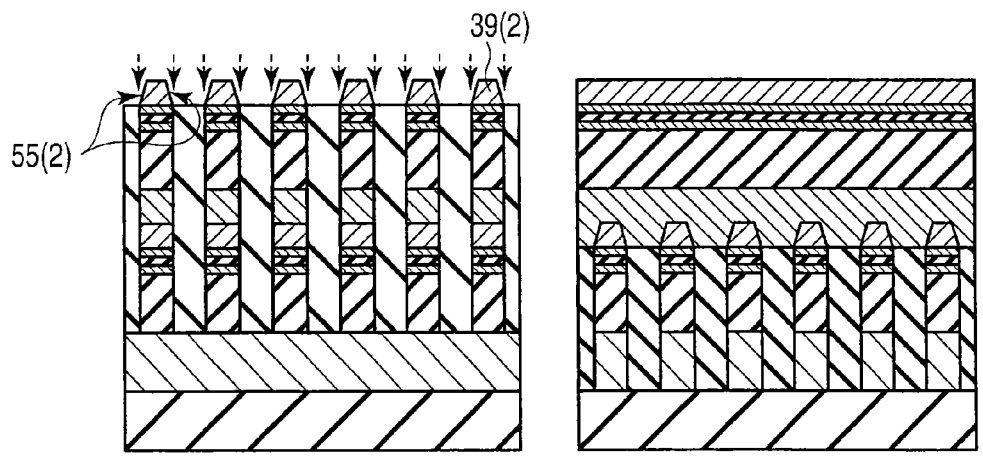
FIGS. 55A and 55B are sectional views showing a step of manufacturing the semiconductor memory device according to the fourth embodiment.

As shown in FIGS. 55A and 55B, for example, a dry etching method such as RIE is used to recess the tip portion of the conductive layer 39(2) so as to form a taper angle 55(2) at the tip portion of the conductive layer 39(2) in the word line direction A. In this case, since the bit line BL(1) is formed on the conductive layer 39(1), the taper angle 55 is not formed at the tip portion of the conductive layer 39(1).

As shown in FIGS. 56A and 56B, manufacturing steps similar to those described above are used to form the second layer of memory cell MC(2). Subsequently, for example, the RIE method is used to etch back (recess) the interlayer insulating film 30-4 until the bottom surface (39U(3)) of the conductive layer 39(3) almost coincides with (is almost flush) with the bottom surface (BLU(3)) serving as the bit line BL(3).

As shown in FIGS. 57A and 57B, for example, the dry etching method such as RIE is used to recess the tip portion of the conductive layer 39(3) so as to form a taper angle 55(3) at the tip portion of the conductive layer 39(3) in the bit line direction B.

As shown in FIGS. 58A and 58B, manufacturing steps similar to those described above are used to form the third layer of memory cell MC(3). Subsequently, for example, the RIE method is used to etch back (recess) the interlayer insulating film 30-5 until the bottom surface (39U(4)) of the conductive layer 39(4) almost coincides with (is almost flush) with the bottom surface (WLU(4)) serving as the word line WL(4).

As shown in FIGS. 59A and 59B, for example, the dry etching method such as RIE is used to recess the tip portion of the conductive layer 39(4) so as to form a taper angle 55(4) at the tip portion of the conductive layer 39(4) in the word line direction A.

Thereafter, a manufacturing method substantially similar to that in the above-described second embodiment is used to manufacture the semiconductor memory device shown in FIGS. 50A and 50B described above.

<Operation and Effects>

The semiconductor memory device and the method of manufacturing the semiconductor memory device according to the fourth embodiment exert at least effects similar to those described above in (1) to (4). Moreover, in the present example, since a plurality of layers (four layers) of cell arrays are stacked, the effects (1) and (2) are more significant.

In addition, both the tip portions of the conductive layers 39(2) and 39(4) have taper angles 55(2) and 55(4), respectively, in the word line direction A, and both the tip portions of the conductive layers 39(1) and 39(3) further have taper angles 55(1) and 55(3), respectively, in the bit line direction B. Thus, in case the word lines WL(2) and WL(4) and bit lines BL(1) and BL(3) corresponding to the conductive layers 39(1) to 39(4) are formed, the larger space between the conductive layers 39(1) to 39(4) allows between the lines to be easily buried. The fourth embodiment is thus further advantageous for improvement of reliability.

Furthermore, the taper angle 55 is not formed on the sectional tip portion of each of the conductive layers 39(1) to 39(4) which is, in a sectional view, separate from the bit lines BL(1) and (3) or the word lines WL(2) and (4). In this sectional view, the conductive layers 39(1) to 39(4) have a rectangle structure and, a top surface of the conductive layers 39(1) to 39(4) have a length which equaled to a bottom surface of the bit lines BL(1) and (3) or the word lines WL(2) and (4). On the other hand, the conductive layers 39(1) to 39(4) have a trapezium structure in the sectional view, continuing the bit lines BL(1) and (3) or the word lines WL(2) and (4). This prevents a reduction in a connection area for the bit lines BL(1) and BL(3) or the word lines WL(2) and WL(4) formed on the conductive layers 39(1) to 39(4). It is prevent form reducing the contact area between each of the memory cells MC(1) to MC(4) and the corresponding one of the bit lines BL(1) and BL(3) or the word lines WL(2) and WL(4).

Fifth Embodiment

Figures 61A, 61B:
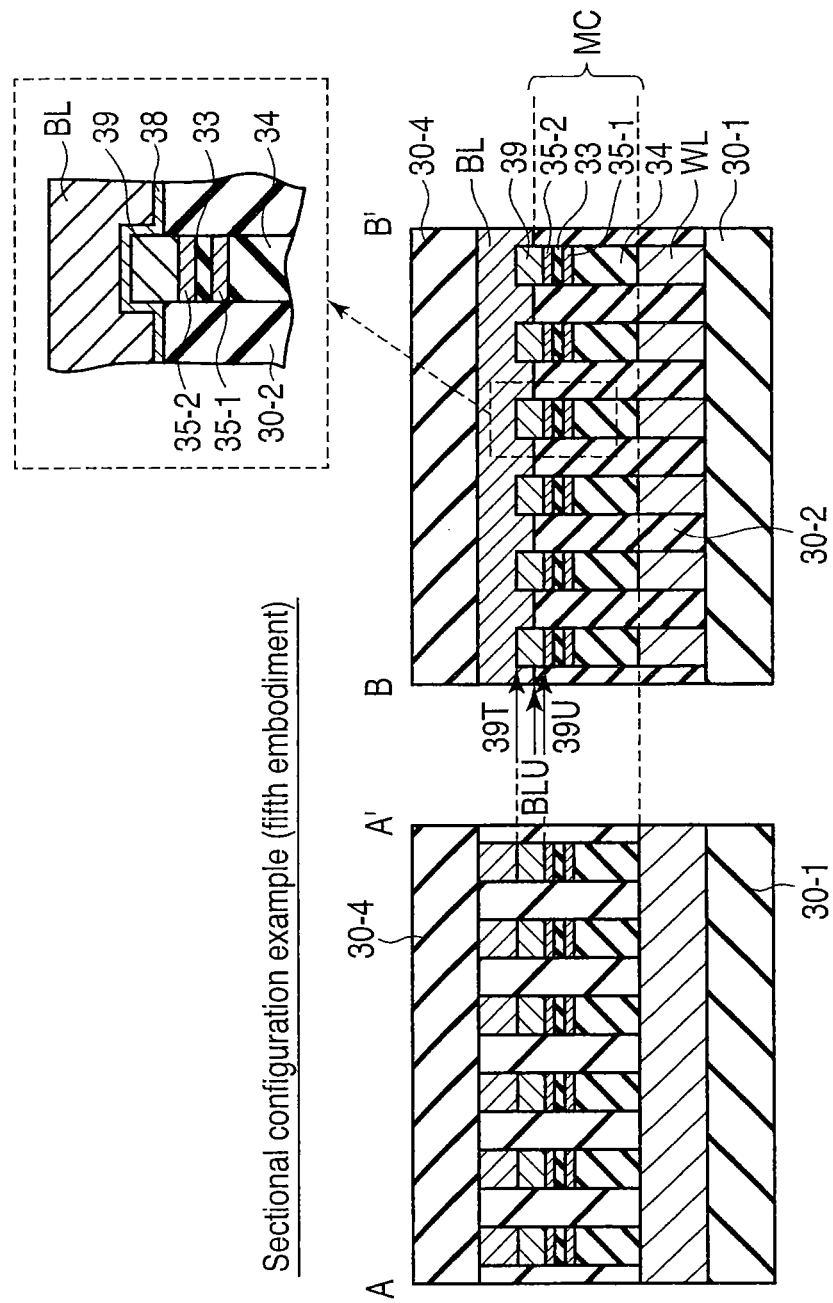
FIG. 61A is a sectional view taken along line A-A' in FIG. 60.
FIG. 61B is a sectional view taken along line B-B' in FIG. 60.

An Example in which a Single Layer of Cell Array is Provided and in which the Bottom Surface of the Upper-Layer Wire is Positioned Between the Bottom Surface and Top Surface of the Conductive Layer Now, a semiconductor memory device according to a fifth embodiment will be described with reference to FIGS. 60 and 61. The present embodiment relates to an example in which a single layer of memory cell MC is provided and in which the interface between the upper-layer wire BL and the interlayer insulating film 30-2 formed between the memory cells is positioned lower than the top surface of the conductive layer 39 and higher than the bottom surface of the conductive layer 39. The same aspects as those of the above-described first embodiment will not be described below in detail.

As shown in FIGS. 60 and 61, in the present example, the position (BLU) of the interface between the upper wire BL and the interlayer insulating film 30-2 is lower than the top surface (39T) of the conductive layer and higher than the bottom surface (39U) of the conductive layer (39U<BLU<39T). In other words, the bottom surface BLU of the bit line is located between the bottom surface 39U and top surface 39T of the conductive layer 39 (39U<BLU<39T). In this configuration, since the bottom surface of the bit line BL on the interlayer insulating film 30 is positioned above the bottom surface of the conductive layer 39, the upper side surface of the conductive layer 39 is in contact with the bit line BL. That is, the upper portion of the conductive layer 39 serves as a part of the bit line (upper-layer wire) BL. This enables a reduction in the contribution of the film thickness of the conductive layer 39 to the height in the direction perpendicular to the substrate surface of the semiconductor memory device. Therefore, the fifth embodiment is advantageous for a reduction in the film thickness in the direction perpendicular to the substrate surface.

<Manufacturing Method>

Now, an example of the method of manufacturing the semiconductor memory device according to the fifth embodiment will be described with reference to FIGS. 62A and 62B to FIGS. 65A and 65B. Here, the configuration of the semiconductor memory device shown in FIGS. 61A and 61B described above will be described by way of example. The same aspects as those of the above-described second embodiment will not be described below.

Figure 62A:
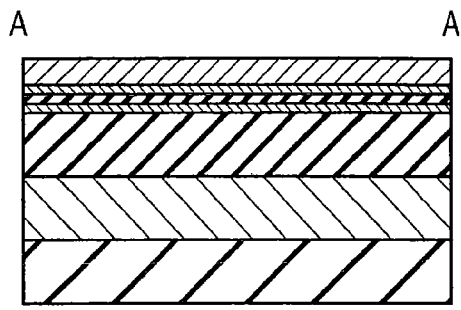
FIGS. 62A and 62B are sectional views showing a step of manufacturing the semiconductor memory device according to the fifth embodiment.
Figure 62B:
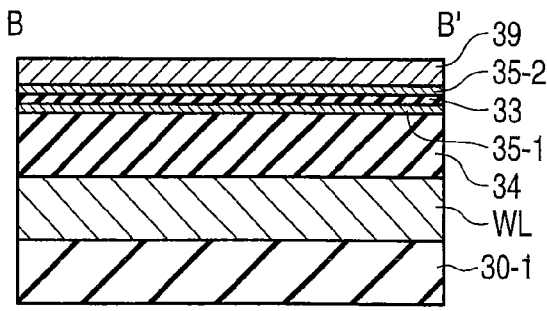

As shown in FIGS. 62A and 62B, manufacturing steps similar to those described above are used to form a conductive layer 39, an upper electrode 35-2, a storage layer 33, a lower electrode 35-1, a diode 34, and a word line WL on the interlayer insulating film 30-1.

Figure 63A:
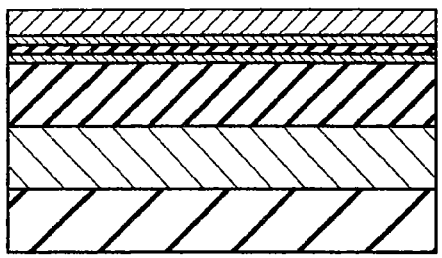
FIGS. 63A and 63B are sectional views showing a step of manufacturing the semiconductor memory device according to the fifth embodiment.
Figure 63B:
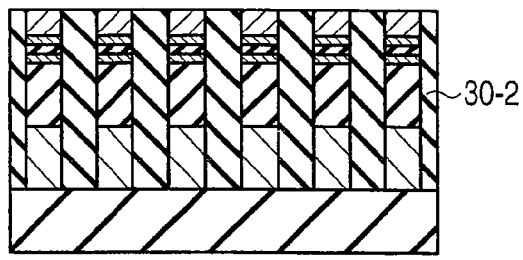

As shown in FIGS. 63A and 63B, manufacturing steps similar to those described above are used to form an interlayer insulating film 30-2.

Figure 64A:
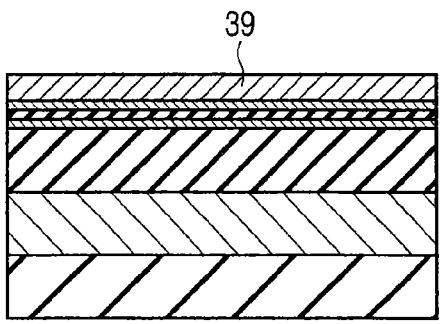
FIGS. 64A and 64B are sectional views showing a step of manufacturing the semiconductor memory device according to the fifth embodiment.
Figure 64B:
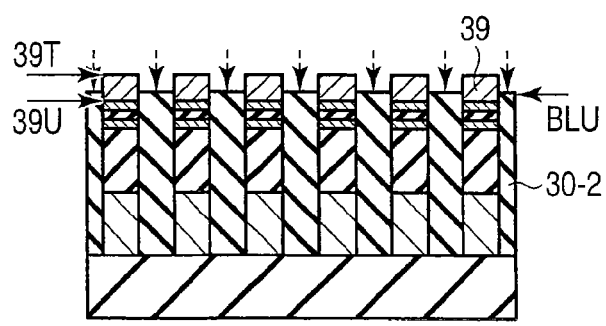

As shown in FIGS. 64A and 64B, for example, the RIE method is used to etch back (recess) the top surface (BLU) of the interlayer insulating film 30-2 until the top surface (BLU) is positioned between the bottom surface (39U) and top surface (39T) of the conductive layer 39 (39U<BLU<39T).

During this step, the dry etching method such as RIE is used to etch the interlayer insulating film 30-2 with, for example, the etching time controlled so as to offset the top surface (BLU) of the interlayer insulating film 30-2 from the bottom surface of the conductive film 39, thus achieving the positional relationship (39U<BLU<39T). Here, if the top surface of the interlayer insulating film 30-2 is lower than the bottom surface of the conductive film 39 as a result of etching-over, then when a bit line BL is subsequently formed, the upper electrode 35-2 located adjacent to the bit line BL in the bit line direction may be short-circuited. As a result, characteristics of variable resistance element is changed in set operation and reset operation. Thus, the offset is provided so as to prevent the top surface of the interlayer insulating film 30-2 from being lower than the bottom surface of the conductive film 39. This advantageously allows the adjacent memory cells MC to be prevented from being short-circuited.

As shown in FIGS. 65A and 65B, for example, a bit line BL is formed on the conductive layer 39 and on the interlayer insulating film 30-2. Subsequently, manufacturing steps similar to those described above are carried out to manufacture the semiconductor memory device shown in FIGS. 61A and 61B described above, according to the above-described manufacturing method.

<Operation and Effects>

The semiconductor memory device and the method of manufacturing the semiconductor memory device according to the fifth embodiment exert at least effects similar to those described above in (1) to (4).

Moreover, in the present example, the interface between the bottom surface of the bit line and the interlayer insulating film 30-2 is located between the bottom surface 39U and top surface 39T of the conductive layer 39 (39U<BLU<39T).

Thus, during the recessing step (FIGS. 64A and 64B) for the interlayer insulating film 39, the adjacent memory cells MC are advantageously prevented from being short-circuited as a result of etching-over. That is, the present embodiment provides that manufacturing method that is unsusceptible to variations among manufacturing processes.

Sixth Embodiment

An Example in which a Single Layer of Cell Array is Provided and in which the Conductive Layer has a Taper Angle Now, a semiconductor memory device and a method of according to the semiconductor device according to a sixth embodiment will be described. The present embodiment relates to an example in which the device comprises a single layer of cell array and the conductive layer 39 with a taper angle and in which the bottom surface BLU of the bit line is located between the bottom surface 39U and top surface 39T of the conductive layer 39 (39U<BLU<39T). The same aspects as those of the above-described second embodiment will not be described below in detail.

<Examples of a Planar Configuration and a Sectional Configuration>

First, examples of planar and sectional configurations of the semiconductor memory device according to the present example will be described with reference to FIG. 66 and FIGS. 67A and 67B.

Figures 67A, 67B:
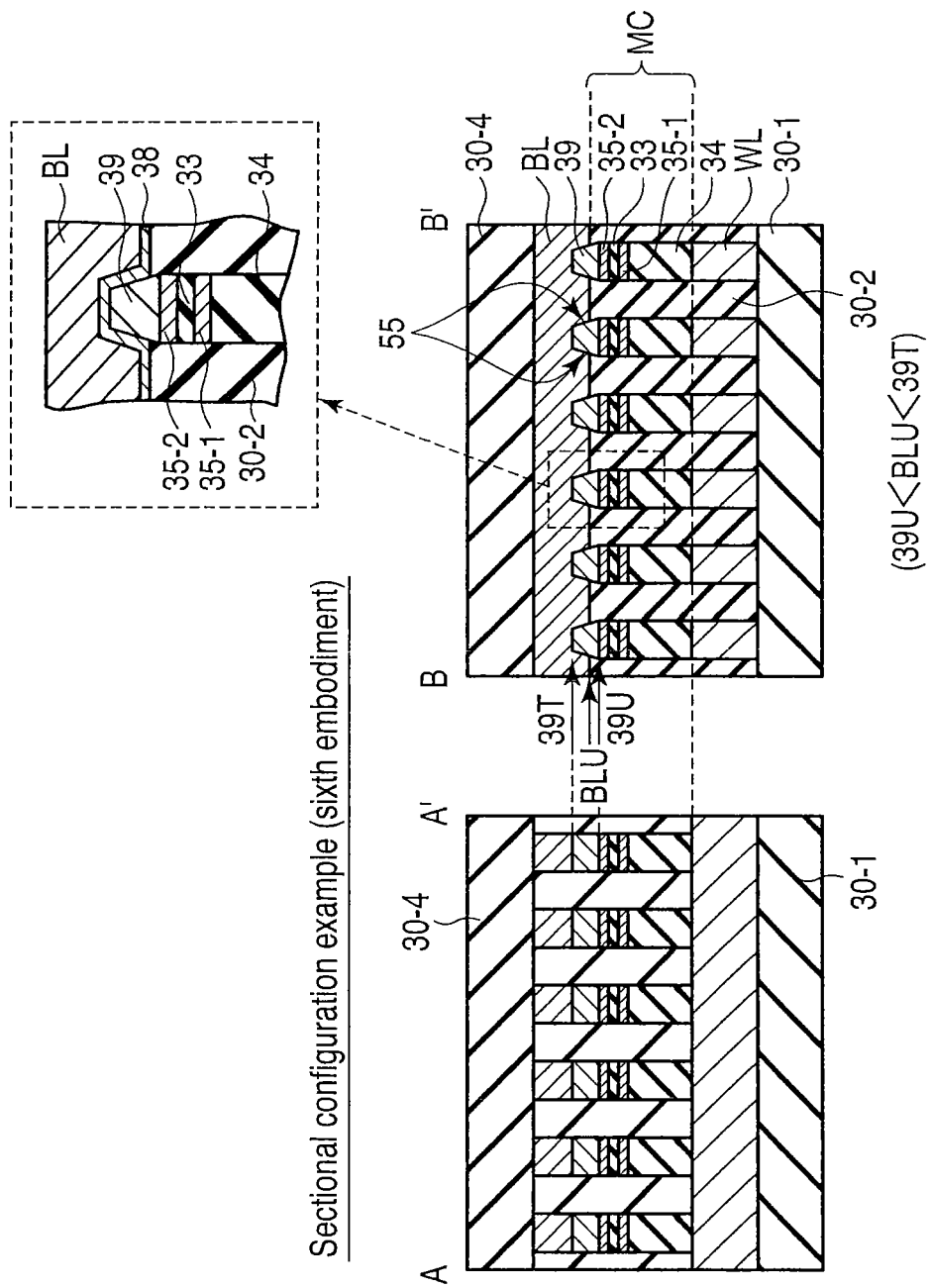
FIG. 67A is a sectional view taken along line A-A' in FIG. 66.
FIG. 67B is a sectional view taken along line B-B' in FIG. 66.

As shown in FIG. 66 and FIGS. 67A and 67B, the present example is different from the above-described third embodiment in that the present example involves a single layer of cell array and the taper angle 55 further provided at the tip portion of the conductive layer 39 in the bit line direction B and in that the bottom surface BLU of the bit line is located between the bottom surface 39U and top surface 39T of the conductive layer 39 (39U<BLU<39T).

<Manufacturing Method>

Now, an example of the method of manufacturing the semiconductor memory device according to the sixth embodiment will be described with reference to FIGS. 68A and 68B to FIGS. 71A and 71B. Here, the configuration of the semiconductor memory device shown in FIGS. 67A and 67B described above will be described by way of example. The same aspects as those of the above-described third embodiment will not be described below.

Figure 68A:
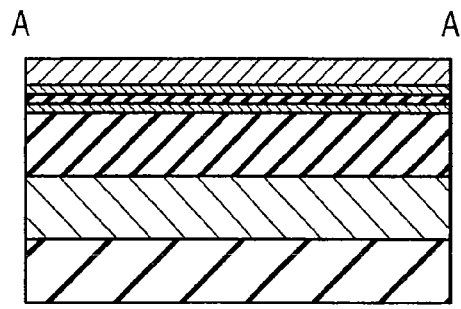
FIGS. 68A and 68B are sectional views showing a step of manufacturing the semiconductor memory device according to the sixth embodiment.
Figure 68B:
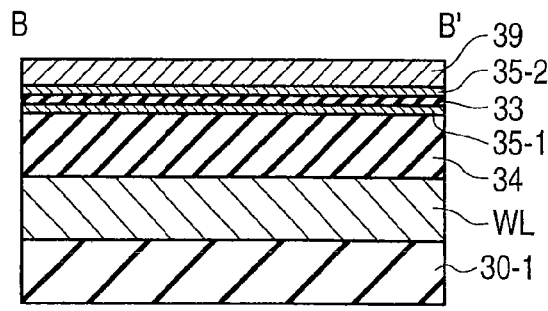

As shown in FIGS. 68A and 68B, similar manufacturing steps are used to form an interlayer insulating film 30-1, a word line WL, a diode 34, a lower electrode 35-1, a storage layer 33, an upper electrode 35-2, and a conductive layer 39 on the above-described formed peripheral circuits.

Figure 69A:
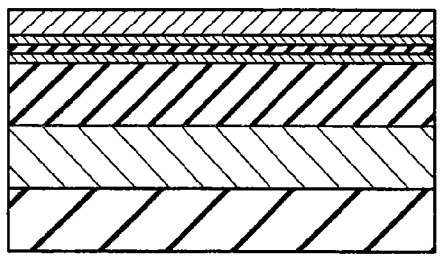
FIGS. 69A and 69B are sectional views showing a step of manufacturing the semiconductor memory device according to the sixth embodiment.
Figure 69B:
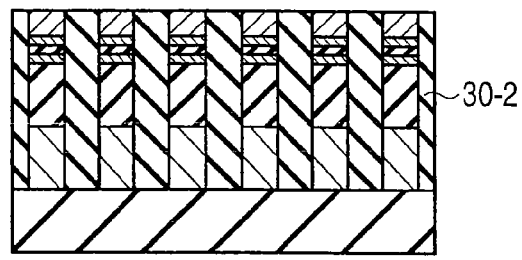

As shown in FIGS. 69A and 69B, manufacturing steps similar to those described above are used to form an interlayer insulating film 30-2.

Figure 70A:
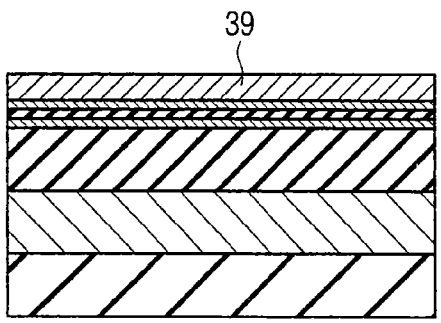
FIGS. 70A and 70B are sectional views showing a step of manufacturing the semiconductor memory device according to the sixth embodiment.
Figure 70B:
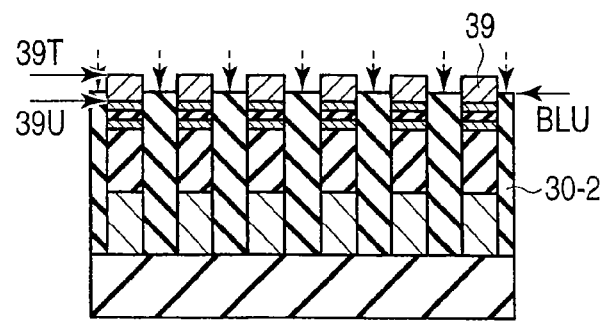

As shown in FIGS. 70A and 70B, manufacturing steps similar to those described above and, for example, the RIE method are used to offset the bottom surface (BLU) of the interlayer insulating film 30-2 with, for example, the etching time controlled so as to achieve the positional relationship (39U<BLU<39T). This advantageously allows defects resulting from possible over-etching to be prevented.

Figure 71A:
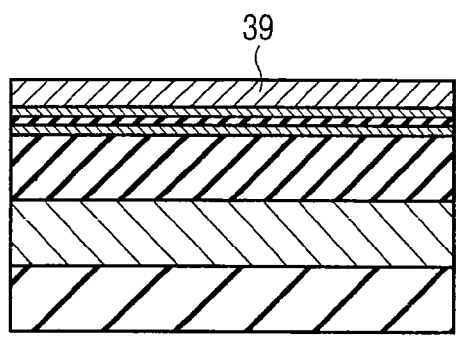
FIGS. 71A and 71B are sectional views showing a step of manufacturing the semiconductor memory device according to the sixth embodiment.
Figure 71B:
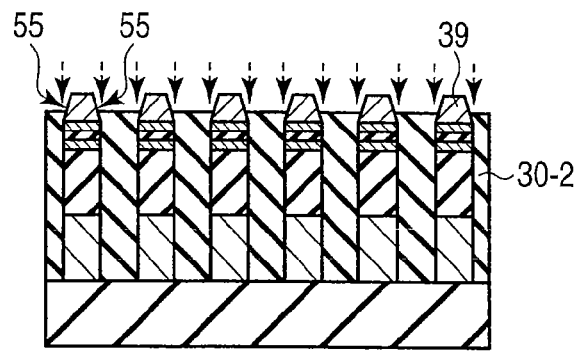

As shown in FIGS. 71A and 71B, for example, the dry etching method such as RIE is used to recess the tip portion of the conductive layer 39 in the bit line direction B so as to form a taper angle 55 at the tip portion. In this step, the dry etching method such as RIE may be carried out under different conditions. Alternatively, the amount of time for the etch-back step shown in FIGS. 70A and 70B described above may be increased such that the etch-back step lasts longer.

Subsequently, manufacturing steps similar to those described above carried out used to form the semiconductor memory device shown in FIGS. 67A and 67B described above.

<Operation and Effects>

The semiconductor memory device and the method of manufacturing the semiconductor memory device according to the sixth embodiment exert at least effects similar to those described above in (1) to (4). Moreover, in the present example, the conductive layer 39 has the taper angle 55 at the tip portion. Furthermore, in the present example, the interface BLU between the bottom surface of the bit line and the interlayer insulating film 30-2 is located between the bottom surface 39U and top surface 39T of the conductive layer 39 (39U<BLU<39T). The sixth embodiment is thus further advantageous for improving reliability.

Additionally, the configuration and manufacturing method as described in the present example can be applied as required.

Comparative Example

Now, for comparison with the semiconductor memory devices and the methods for manufacturing the semiconductor memory devices according to the above-described outline and first to sixth embodiments, a semiconductor memory device according to a comparative example will be described with reference to FIGS. 72A and 72B.

As shown in FIGS. 72A and 72B, in the semiconductor memory device according to the comparative example, the interface between an upper wire (BL(1), WL(2), BL(2), or WL(3)) and a corresponding one of interlayer insulating films 130-2 to 130-6 is equal to the top surface of the upper wire (BL(1), WL(2), BL(2), or WL(3)). Thus, each of the top surfaces 139T(1) to 139T(4) of conductive layers 139(1) to 139(4) is in contact only with the bottom surface of the corresponding one of the upper wires (BL(1), WL(2), BL(2), and WL(3)).

In the above-described configuration, the height of the comparative example in the height in the direction perpendicular to the substrate surface of the semiconductor memory device becomes high the film thickness of the conductive layers 139(1) to 139(4).

This results in an increase in the height of the element in the direction perpendicular to the substrate surface. In addition, in the configuration, the upper-layer memory cell is processed together with the wiring wire and the lower-layer memory cell. This results in an increase in aspect ratio.

As described above, the semiconductor memory device and the method of manufacturing the semiconductor memory device according to the comparative example are disadvantageous for shrinking.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, comprising:
    forming a first interlayer insulating film;
    forming a lower-layer wire on the first interlayer insulating film;
    forming a storage layer and a conductive layer on the lower-layer wire;
    processing the conductive layer, the storage layer, and the lower-layer wire down to the first interlayer insulating film to form a trench;
    burying and forming a second interlayer insulating film in the trench;
    first etching back the second interlayer insulating film by a CMP method using the conductive layer as a stopper;
    second etching back a top surface of the second interlayer insulating film by a different process than the CMP method of the first etching back, to be lower than a top surface of the conductive layer; and
    forming an upper-layer wire on the second interlayer insulating film and on the conductive layer.

2. The method of claim 1, wherein the burial and formation of the second interlayer insulating film in the trench comprises burying the second interlayer insulating film in the trench.

3. The method of claim 1, further comprises forming a taper angle at a tip portion of the conductive layer.

4. The method of claim 1, wherein the top surface of the second interlayer insulating film is as high as a bottom surface of the conductive layer when the etching back the top surface of the second interlayer insulating film.

5. The method of claim 1, wherein the top surface of the second interlayer insulating film is a higher than a bottom surface of the conductive layer when the etching back the top surface of the second interlayer insulating film.

6. The method of claim 1, further comprises, before forming the first interlayer insulating film, forming a peripheral circuit for the semiconductor device comprising at least a row decoder, a column decoder, and a sense amplifier, on a semiconductor substrate in an element region.

7. The method of claim 1, wherein a diode layer is formed when forming the storage layer and the conductive layer, and the diode is processed when processing the conductive layer, the storage layer, and the lower-layer wire down to the first interlayer insulating film to form a trench.

* * * * *